US012664414B2

(12) United States Patent
Li

(10) Patent No.: US 12,664,414 B2
(45) Date of Patent: Jun. 23, 2026

(54) COMPUTE IN MEMORY-BASED MACHINE LEARNING ACCELERATOR ARCHITECTURE

(71) Applicant: QUALCOMM Incorporated, San Diego, CA (US)

(72) Inventor: Ren Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1173 days.

(21) Appl. No.: 17/359,297

(22) Filed: Jun. 25, 2021

(65) Prior Publication Data

US 2022/0414443 A1 Dec. 29, 2022

(51) Int. Cl.
| | |
|---|---|
| *G06N 3/065* | (2023.01) |
| *G06F 7/544* | (2006.01) |
| *G06J 1/00* | (2006.01) |
| *G06N 3/044* | (2023.01) |
| *G06N 3/045* | (2023.01) |
| *G06N 3/048* | (2023.01) |
| *H03M 1/12* | (2006.01) |

(52) U.S. Cl.
CPC ........... *G06N 3/065* (2023.01); *G06F 7/5443* (2013.01); *G06J 1/005* (2013.01); *G06N 3/044* (2023.01); *G06N 3/045* (2023.01); *G06N 3/048* (2023.01); *H03M 1/12* (2013.01)

(58) Field of Classification Search
CPC .................................................... G06F 7/5443
See application file for complete search history.

(56) References Cited

U.S. PATENT DOCUMENTS

| | | | |
|---|---|---|---|
| 10,331,983 B1 | 6/2019 | Yang et al. | |
| 10,972,139 B1 * | 4/2021 | Luo ......................... | G06N 3/044 |
| 11,580,191 B1 * | 2/2023 | Gural ....................... | G06F 17/16 |
| 12,327,183 B2 * | 6/2025 | Timofejevs ............ | G06N 3/063 |
| 2020/0019846 A1 * | 1/2020 | Krishnamurthy ..... | G06F 7/5095 |
| 2020/0034148 A1 | 1/2020 | Sumbul et al. | |
| 2020/0073636 A1 | 3/2020 | Cammarota et al. | |
| 2020/0192970 A1 * | 6/2020 | Ma .......................... | G06N 3/044 |

(Continued)

FOREIGN PATENT DOCUMENTS

| | | |
|---|---|---|
| CN | 107657581 A | 2/2018 |

OTHER PUBLICATIONS

Y. Long, T. Na and S. Mukhopadhyay, "ReRAM-Based Processing-in-Memory Architecture for Recurrent Neural Network Acceleration," in IEEE Transactions on Very Large Scale Integration (VLSI) Systems, vol. 26, No. 12, pp. 2781-2794, Dec. 2018, doi : 10.1109/ TVLSI.2018.2819190. (Year: 2018).*

(Continued)

*Primary Examiner* — James Trujillo
*Assistant Examiner* — Markus Anthony Villanueva
(74) *Attorney, Agent, or Firm* — Patterson + Sheridan LLP

(57) ABSTRACT

Certain aspects of the present disclosure provide techniques for processing machine learning model data with a machine learning task accelerator, including: configuring one or more signal processing units (SPUs) of the machine learning task accelerator to process a machine learning model; providing model input data to the one or more configured SPUs; processing the model input data with the machine learning model using the one or more configured SPUs; and receiving output data from the one or more configured SPUs.

30 Claims, 17 Drawing Sheets

(56) References Cited

U.S. PATENT DOCUMENTS

| | | | |
|---|---|---|---|
| 2021/0019115 A1* | 1/2021 | Venkatesh | G06F 7/523 |
| 2023/0074229 A1* | 3/2023 | Jia | G06F 15/7821 |

OTHER PUBLICATIONS

Anonymous. "A Deep Dive Into the Transformer Architecture—The Development of Transformer Models". Deep Learning. EXXACT Blog. Jul. 13, 2020. https://www.exxactcorp.com/blog/Deep-Learning/a-deep-dive-into-the-transformer-architecture-the-development-of-transformer-models (Year: 2020).*

Wang, Chi-Feng. "A Basic Introduction to Separable Convolutions". Towards Data Science. Aug. 13, 2018. https://towardsdatascience.com/a-basic-introduction-to-separable-convolutions-b99ec3102728 (Year: 2018).*

Qiuwen L., et al., "A Mixed Signal Architecture for Convolutional Neural Networks", arXiv:1811.02636v4 [cs.CV] May 2, 2019, 26 Pages.

Bavikadi S., et al., "A Review of In-Memory Computing Architectures for Machine Learning Applications," Proceedings of the 31st Australian Conference on Human-Computer-Interaction, ACMPUB27, New York, NY, USA, Sep. 7, 2020, XP058875773, pp. 89-94.

International Search Report and Written Opinion—PCT/US2022/073154—ISA/EPO—Oct. 18, 2022.

Long Y., et al., "ReRAM-Based Processing-in-Memory Architecture for Recurrent Neural Network Acceleration," IEEE Transactions on Very Large Scale Integration (VLSI) Systems, IEEE Service Center, Piscataway, NJ, USA, vol. 26, No. 12, Dec. 1, 2018, XP011702493, pp. 2781-2794.

Yang X., et al., "ReTransformer : ReRAM-Based Processing-in-Memory Architecture for Transformer Acceleration," Proceedings of the 39th International Conference on Computer-Aided Design, New York, NY, USA, Nov. 2, 2020, XP055967582, pp. 1-9.

Yin S., et al., "Vesti: Energy-Efficient In-Memory Computing Accelerator for Deep Neural Networks," IEEE Transactions on Very Large Scale Integration (VLSI) Systems, IEEE Service Center, Piscataway, NJ, USA, vol. 28, No. 1, Jan. 1, 2020, XP011764254, pp. 48-61.

* cited by examiner $$f_t = \text{sigmoid} \left( W_f \{ h_{t-1}, e_t \} + b_f \right)$$

$$i_t = \text{sigmoid} \left( W_i \{ h_{t-1}, e_t \} + b_i \right)$$

$$O_t = \text{sigmoid} \left( W_o \{ h_{t-1}, e_t \} + b_o \right)$$

$$\hat{c}_t = \textit{tanh} \left( W_{\hat{c}} \{ h_{t-1}, e_t \} + b_{\hat{c}} \right)$$

$$c_t = f_t \cdot c_{t-1} + i_t \cdot \hat{c}_t$$

$$h_t = O_t \cdot \text{tanh} (c_t)$$

$$z_t = \sigma_g \left( W_z \chi_t + U_z h_{t-1} + b_z \right)$$

$$r_t = \sigma_g \left( W_r \chi_t + U_r h_{t-1} + b_r \right)$$

$$\hat{h}_t = \phi_h \left( W_h \chi_t + U_h \left( r_t \odot h_{t-1} \right) + b_h \right)$$

$$h_t = (1 - z_t) \odot h_{t-1} + z_t \odot \hat{h}_t$$

RECURRENT /
RESIDUAL INPUT
1416

DIGITAL POST PROCESSING (DPP) 1400

ANALOG / DIGITAL CONVERTER(S)
1402

GAIN
1404

POOLING
1406

SHIFTING
1408

BIASING
1410

BIT WIDTH SELECTION
1412

NONLINEAR OPERATION
1414

1600

1602

CONFIGURE ONE OR MORE SIGNAL PROCESSING UNITS (SPU'S) OF A MEMORY-BASED TASK ACCELERATOR TO PROCESS A MACHINE LEARNING MODEL

1604

PROVIDE MODEL INPUT DATA TO THE ONE OR MORE CONFIGURED SPU'S

1606

PROCESS THE MODEL INPUT DATA WITH THE MACHINE LEARNING MODEL USING THE ONE OR MORE CONFIGURED SPU'S

1608

RECEIVE OUTPUT DATA FROM THE ONE OR MORE CONFIGURED SPU'S

COMPUTE IN MEMORY-BASED MACHINE LEARNING ACCELERATOR ARCHITECTURE

INTRODUCTION

Aspects of the present disclosure relate to improved architectures for performing machine learning tasks, and in particular to compute in memory-based architectures for supporting advanced machine learning architectures.

Machine learning is generally the process of producing a trained model (e.g., an artificial neural network, a tree, or other structures), which represents a generalize fit to a set of training data that is known a priori. Applying the trained model to new data produces inferences, which may be used to gain insights into the new data. In some cases, applying the model to the new data is described as "running an inference" on the new data.

As the use of machine learning has proliferated for enabling various machine learning (or artificial intelligence) tasks, the need for more efficient processing of machine learning model data has arisen. In some cases, dedicated hardware, such as machine learning (or artificial intelligence) accelerators, may be used to enhance a processing system's capacity to process machine learning model data. However, such hardware requires space and power, which is not always available on the processing device. For example, "edge processing" devices, such as mobile devices, always on devices, internet of things (IoT) devices, and the like, have to balance processing capabilities with power and packaging constraints. Consequently, other aspects of a processing system are being considered for processing machine learning model data.

Memory devices are one example of another aspect of a processing system that may be leveraged for performing processing of machine learning model data through so-called compute-in-memory (CIM) processes. Unfortunately, conventional CIM processes may not be able to perform processing of all aspects of advanced model architectures, such as recurrent neural networks (RNNs), attention models (e.g., attention-based neural networks), bidirectional encoder representations from transformers (BERT) models, and the like. These advanced model architectures have significant utility in many technical domains, including healthcare, natural language processing, speech recognition, self-driving cars, recommender systems, and others.

Accordingly, systems and methods are needed for performing computation in memory of a wider variety of machine learning model architectures.

BRIEF SUMMARY

Certain aspects provide a machine learning task accelerator, comprising: one or more mixed signal processing units (MSPUs), each respective MSPU of the one or more MSPUs comprising: a compute-in-memory (CIM) circuit; a local activation buffer connected to the CIM circuit and configured to store activation data for processing by the CIM circuit; one or more analog to digital converters (ADCs) connected to the CIM circuit and configured to convert analog computation result signals from the CIM circuit to digital computation result data; a first nonlinear operation circuit connected to one or more outputs of the one or more ADCs and configured to perform nonlinear processing on the digital computation result data; a hardware sequencer circuit configured to execute instructions received from a host system and control operation of the MSPU; and a local direct memory access (DMA) controller configured to control access to the CIM circuit; a digital multiplication and accumulation (DMAC) circuit connected to the one or more MSPUs and configured to perform multiplication and accumulation operations on activation data output from one or more of the one or more MSPUs; a digital element-wise multiplication and accumulation circuit connected to the one or more MSPUs and configured to perform element-wise multiplication and element-wise accumulation operations on activation data output from one or more of the one or more MSPUs; and a second nonlinear operation circuit connected to the one or more MSPUs.

Further aspects provide a method of processing machine learning model data with a machine learning task accelerator, comprising: configuring one or more mixed signal processing units (MSPUs) of the machine learning task accelerator to process a machine learning model; providing model input data to the one or more configured MSPUs; processing the model input data with the machine learning model using the one or more configured MSPUs; and receiving output data from the one or more configured MSPUs.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer readable storage medium comprising code for performing the aforementioned methods as well as those further described herein; and a processing system comprising means for performing the aforementioned methods as well as those further described herein.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Figure 1:
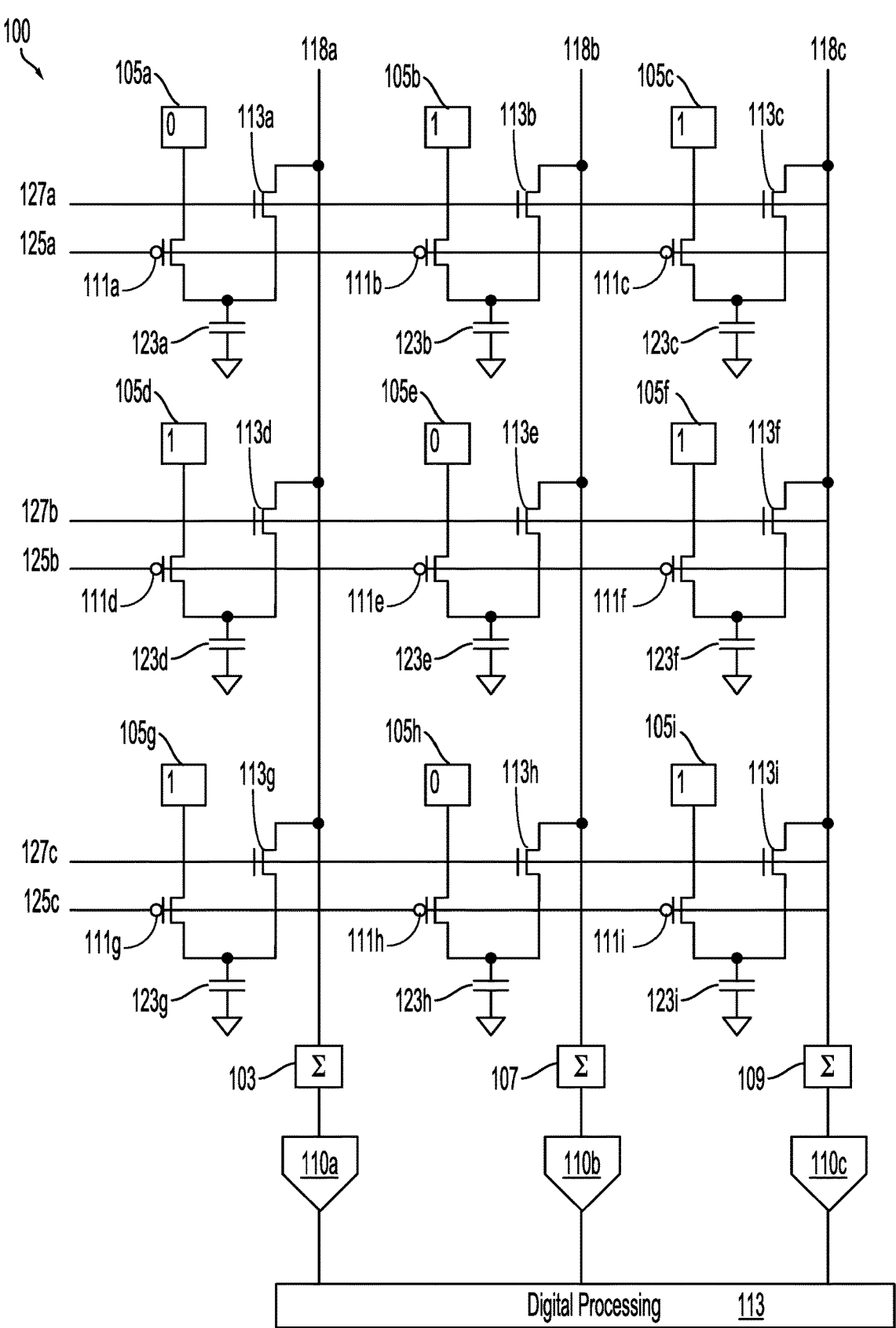
FIG. 1 depicts an example of a compute-in-memory (CIM) array configured for performing machine learning model computations, according to aspects of the present disclosure.

Aspects of the present disclosure provide compute in memory-based architectures for supporting advanced machine learning architectures. In particular, embodiments described herein provide dynamically configurable and flexible machine learning/artificial intelligence accelerators based on compute-in-memory (CIM) processing capabilities.

Embodiments described herein support advanced machine learning architectures within a standalone CIM-based accelerator by implementing a wide range of processing capabilities in the accelerator, including, for example, support for general matrix-matrix multiplication (GEMM), generalized matrix-vector multiplication (GEMV), multiplication, addition, subtraction, nonlinear operations, and other modification operations. The nonlinear operations may include, for example, sigmoid or logistic functions, TanH or hyperbolic tangent functions, rectified linear unit (ReLU), leaky ReLU, parametric ReLU, Softmax, and swish, to name a few examples. Other modification operations may include, for example, max pooling, average pooling, batch normalization, scaling, shifting, adding, subtracting, gating, and dropout, to name a few.

The processing capabilities of the machine learning architectures described herein may be used to implement various machine learning architectures and their related processing functions, including convolutional neural network, recurrent neural networks, recursive neural networks, long short-term memory (LSTM) and gated recurrent unit (GRU)-based neural networks, transformers, encoders, decoders, variational autoencoders, skip networks, attention-based neural networks, bidirectional encoder representations from transformers (BERT) models, decompression, sparse-aware processing, spiking neural network models, binarized neural network (BNN) models, and others. For example, BNN models are deep neural networks that use binary values for activations and weights, instead of full precision values, which allows for performing computations using bitwise operations. The CIM-based machine learning model accelerators described herein can perform bitwise operations extremely efficiently.

These processing capabilities can be used to support a wide range of use cases. For example, for advanced machine learning models may process audio data to support audio speech enhancement, audio context/event detection, automatic speech recognition (ASR), natural language processing (NLP), speech encoding/decoding, transformations, and the like. As another example, advanced machine learning models may process image and video data to support object recognition (e.g., face, landmark, etc.), object detection and tracking (e.g., for autonomous and semi-autonomous vehicles), text recognition, high dynamic range video encoding, and the like. Further examples include user verification, machine translation (MT), text-to-speech (TTS), machine learning-based echo cancellation and noise suppression, and acoustic event detection (AED). Notably, these are just a few examples, and many others exist.

Conventional CIM architectures generally cannot support the full range of machine learning operations for advanced machine learning architectures, such as those implemented in deep neural networks. Consequently, while CIM processing can offload processing from other elements of a host processing system, there are still external dependencies (i.e., external to the CIM component) that require moving data to another processor across a data bus, and thereby incurring power and latency processing penalties. For example, certain nonlinear operations like Softmax may require relying on a DSP external to a CIM processing component, which mitigates many of the benefits of processing locally in a CIM component.

By consolidating the functional capabilities necessary to support advanced machine learning architectures within a CIM-based accelerator, the benefits of CIM can be maximized in a processing system. For example, latency and power use may be beneficially reduced compared to processing systems using multiple acceleration components sharing data over a host system data bus. Further, host processing system memory utilization may be reduced for the acceleration task and therefore useable by other tasks. Further yet, higher degrees of processing parallelization may be achieved within the host processing system.

Example Compute in Memory (CIM) Array

FIG. 1 depicts an example of a compute-in-memory (CIM) circuit 100, which may be referred to as a CIM array, configured for performing machine learning model computations, according to aspects of the present disclosure. In this example, CIM array 100 is configured to simulate MAC operations using mixed analog/digital operations for an artificial neural network. Accordingly, as used herein, the terms multiplication and addition may refer to such simulated operations. CIM array 100 can be used to implement aspects of the compute-in-memory methods described herein.

In the depicted embodiment, CIM array 100 includes pre-charge word lines (PCWLs) 125*a*, 125*b* and 125*c* (collectively 125), read word lines (RWLs) 127*a*, 127*b*, and 127*c* (collectively 127), analog-to-digital converters (ADCs) 110*a*, 110*b* and 110*c*, (collectively 110), a digital processing unit 113, bitlines 118*a*, 118*b*, and 118*c* (collectively 118), PMOS transistors 111*a*-111*i* (collectively 111), NMOS transistors 113*a*-113*i* (collectively 113), and capacitors 123*a*-123*i* (collectively 123).

Weights associated with a neural network layer may be stored in static random-access memory (SRAM) bit cells of CIM array 100. In this example, binary weights are shown in the SRAM bitcells 105a-105i of CIM array 100. Input activations (e.g., input values that may be an input vector) are provided on the PCWLs 125a-c.

Multiplication occurs in each bit cell 105a-105i of CIM array 100 associated with a bitline and the accumulation (summation) of all the bitcell multiplication results occurs on the same bitline for one column. The multiplication in each bitcell 105a-105i is in the form of an operation equivalent to an AND operation of the corresponding activation and weight, where the result is stored as a charge on the corresponding capacitor 123. For example, a product of 1, and consequently a charge on the capacitor 123, is produced only where the activation is one (here, because a PMOS is used, the PCWL is zero for an activation of one) and the weight is one. However, in other embodiments, the bit cells may be configured in an XNOR operating mode. Notably, bit cells 105a-105i are just one example, and other types of bit cells may be used in CIM arrays.

For example, in an accumulating stage, RWLs 127 are switched to high so that any charges on capacitors 123 (which is based on corresponding bitcell (weight) and PCWL (activation) values) can be accumulated on corresponding bitlines 118. The voltage values of the accumulated charges are then converted by ADCs 110 to digital values (where, for example, the output values may be a binary value indicating whether the total charge is greater than a reference voltage). These digital values (outputs) may be provided as input to another aspect of a machine learning model, such as a following layer.

When activations on pre-charge word lines (PCWLs) 125a, 125b and 125c are, for example, 1, 0, 1, then the sums of bitlines 118a-c correspond to 0+0+1=1, 1+0+0=1, and 1+0+1=2, respectively. The output of the ADCs 110a, 110b and 110c are passed on to the digital processing unit 113 for further processing. For example, if CIM 100 is processing multi-bit weight values, the digital outputs of ADCs 110 may be summed to generate a final output.

The exemplary 3×3 CIM circuit 100 may be used, for example, for performing efficient 3-channel convolution for three-element kernels (or filters), where the weights of each kernel correspond to the elements of each of the three columns, so that for a given three-element receptive field (or input data patch), the outputs for each of the three channels are calculated in parallel.

Notably, while FIG. 1 describes an example of CIM using SRAM cells, other memory types can be used. For example, dynamic random access memory (DRAM), magnetoresistive random-access memory (MRAM), and resistive random-access memory (ReRAM or RRAM) can likewise be used in other embodiments.

Example CIM Array Bit Cells

Figure 2A:
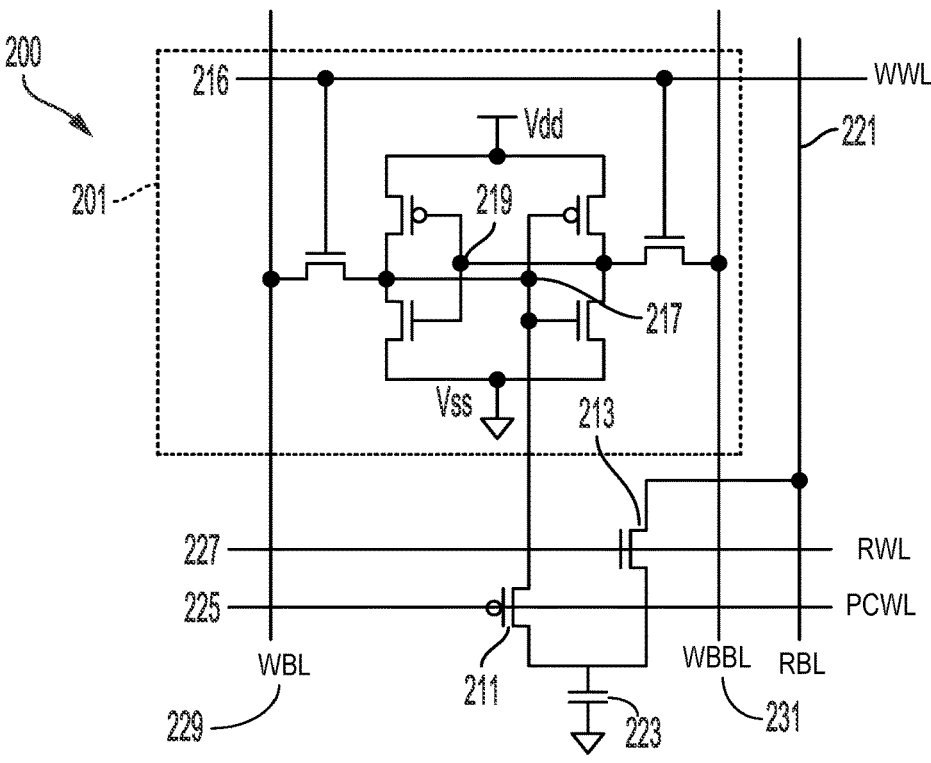
FIGS. 2A and 2B depict example bit cells of a CIM array, according to aspects of the present disclosure.

FIG. 2A depicts additional details of an exemplary bitcell 200.

Aspects of FIG. 2A may be exemplary of or otherwise relate to aspect of FIG. 1. In particular, bitline 221 is similar to the bitline 118a, capacitor 223 is similar to the capacitor 123a of FIG. 1, read word line 227 is similar to the read word line 127a of FIG. 1, pre-charge word line 225 is similar to the pre-charge word line 125a of FIG. 1, PMOS transistor 211 is similar to PMOS transistor 111a of FIG. 1, and NMOS transistor 213 is similar to NMOS transistor 113 of FIG. 1.

The bitcell 200 includes a static random access memory (SRAM) cell 201, which may be representative of SRAM bitcells 105a of FIG. 1, as well as transistor 211 (e.g., a PMOS transistor), transistor 213 (e.g., an NMOS transistor), and capacitor 223 coupled to ground. Although a PMOS transistor is used for the transistor 211, other transistors (e.g., an NMOS transistor) can be used in place of the PMOS transistor, with corresponding adjustment (e.g., inversion) of their respective control signals. The same applies to the other transistors described herein. The additional transistors 211 and 213 are included to implement the compute-in-memory array, according to aspects of the present disclosure. In one aspect, the SRAM cell 201 is a conventional six transistor (6T) SRAM cell.

Programming of weights in the bitcell may be performed once for a multitude of activations. For example, in operation, the SRAM cell 201 receives only one bit of information at nodes 217 and 219 via a write word line (WWL) 216. For example, during write (when WWL 216 is high), if write bit line (WBL) 229 is high (e.g., "1"), then node 217 sets to high and node 219 sets to low (e.g., "0"); or if WBL 229 is low, then node 217 sets to low and node 219 sets to high. Conversely, during write (when WWL 216 is high), if write bit bar line (WBBL) 231 is high, then node 217 sets to low and node 219 sets to high; or if WBBL 229 is low, then node 217 sets to high and node 219 sets to low.

The programming of weights may be followed by an an activation input and multiplication step to charge the capacitors in accordance with the corresponding products. For example, the transistor 211 is activated by an activation signal through a pre-charge word line (PCWL) 225 of the compute-in-memory array to perform the multiplication step. Then, transistor 213 is activated by a signal through another word line (e.g., read word line (RWL) 227) of the compute-in-memory array to perform the accumulation of the multiplication value from bitcell 200 with other bitcells of an array, such as described above with respect to FIG. 1.

If node 217 is a "0," (e.g., when the stored weight value is "0") the capacitor 223 will not be charged if a low PCWL indicates an activation of "1" at the gate of the transistor 211. Accordingly, no charge is provided to a bitline 221. However, if node 217, which corresponds to the weight value, is a "1", and PCWL is set to low (e.g., when the activation input is high), which turns on PMOS transistor 211, which acts as a short, allowing capacitor 223 to be charged. After the capacitor 223 is charged, the transistor 211 is turned off so the charge is stored in the capacitor 223. To move the charge from the capacitor 223 to the bitline 221, the NMOS transistor 213 is turned on by RWL 227 causing the NMOS transistor 213 to act as a short.

Table 1 illustrates an example of compute-in-memory array operations according to an AND operational setting, such as may be implemented by bitcell 200 in FIG. 2A.

TABLE 1

| Bitcell AND Operation | | | |
| --- | --- | --- | --- |
| Activation | PCWL | Cell Node (Weight) | Capacitor Node |
| 1 | 0 | 1 | 1 |
| 1 | 0 | 0 | 0 |
| 0 | 1 | 1 | 0 |
| 0 | 1 | 0 | 0 |

A first column (Activation) of Table 1 includes possible values of an incoming activation signal.

A second column (PCWL) of Table 1 includes PCWL values that activate transistors designed to implement compute-in-memory functions according to aspects of the present disclosure. Because the transistor 211 in this example is a PMOS transistor, the PCWL values are inverses of the activation values. For example, the compute-in-memory array includes the transistor 211 that is activated by an activation signal (PCWL signal) through the pre-charge word line (PCWL) 225.

A third column (Cell Node) of Table 1 includes weight values stored in the SRAM cell node, for example, corresponding to weights in a weight tensor, may be used in convolution operations.

A fourth column (Capacitor Node) of Table 1 shows the resultant products that will be stored as charge on a capacitor. For example, the charge may be stored at a node of the capacitor 223 or a node of one of the capacitors 123a-123i. The charge from the capacitor 223 is moved to the bitline 221 when the transistor 213 is activated. For example, referring to the transistor 211, when the weight at the cell node 217 is a "1" (e.g., high voltage) and the input activation is a "1" (so PCWL is "0"), the capacitor 223 is charged (e.g., the node of the capacitor is a "1"). For all other combinations, the capacitor node will have a value of 0.

Figure 2B:
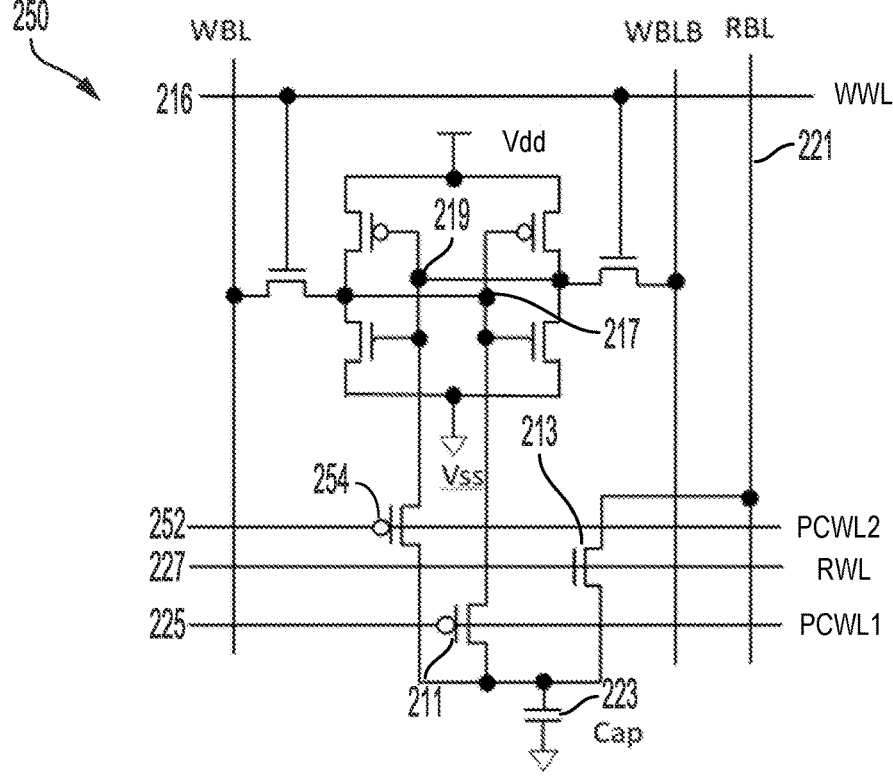

FIG. 2B depicts additional details of another exemplary bitcell 250.

Bitcell 250 differs from bitcell 200 in FIG. 2A primarily based on the inclusion of an additional pre-charge word line 252 coupled to an additional transistor 254. Pre-charge word line 252 allows for bitcell 250 to be placed in an AND operating mode or an XNOR operating mode based on its state. For example, when pre-charge word line 252 is tied high, bitcell 250 operates in an AND mode, and otherwise it acts in an XNOR mode.

Table 2 illustrates an example of compute-in-memory array operations similar to Table 1, except according to an XNOR operational setting, such as may be implemented by bitcell 250 in FIG. 2B.

TABLE 2

| | | | | |
|---|---|---|---|---|
| | | Jitcell XNOR Operation | | |
| Activation | PCWL1 | PCWL2 | Cell Node (Weight) | Capacitor Node |
| 1 | 0 | 1 | 1 | 1 |
| 1 | 0 | 1 | 0 | 0 |
| 0 | 1 | 0 | 1 | 0 |
| 0 | 1 | 0 | 0 | 1 |

A first column (Activation) of Table 2 includes possible values of an incoming activation signal.

A second column (PCWL1) of Table 2 includes PCWL1 values that activate transistors designed to implement compute-in-memory functions according to aspects of the present disclosure. Here again, the transistor 211 is a PMOS transistor, the PCWL1 values are inverses of the activation values.

A third column (PCWL2) of Table 2 includes PCWL2 values that activate further transistors designed to implement compute-in-memory functions according to aspects of the present disclosure.

A fourth column (Cell Node) of Table 2 includes weight values stored in the SRAM cell node, for example, corresponding to weights in a weight tensor, may be used in convolution operations.

A fifth column (Capacitor Node) of Table 2 shows the resultant products that will be stored as charge on a capacitor, such as capacitor 223.

Example CIM Array Operation Timing Diagram

Figure 3:
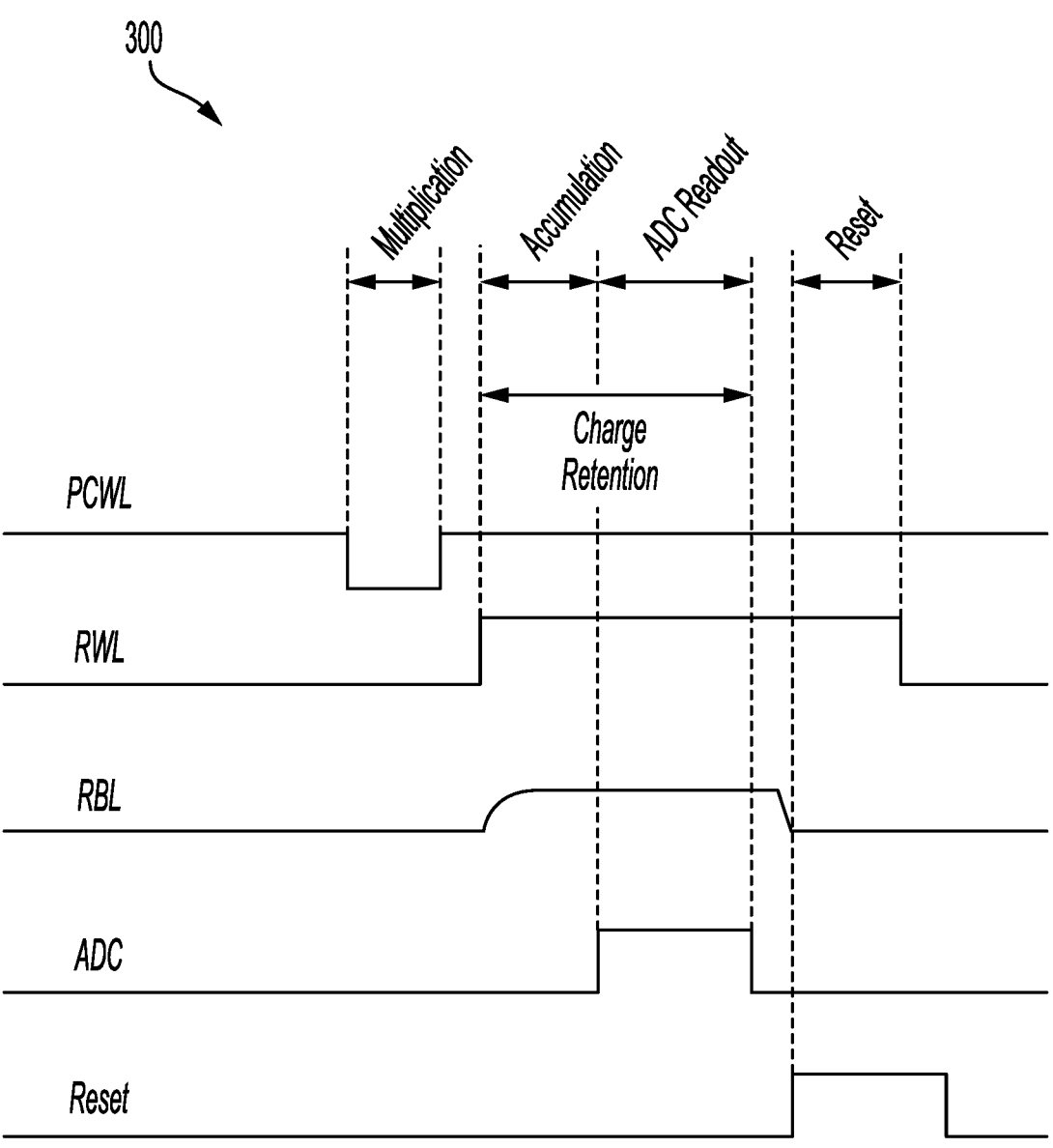
FIG. 3 depicts an example timing diagram of various signals during a CIM array operation.

FIG. 3 depicts an example timing diagram 300 of various signals during a CIM array operation.

In the depicted example, a first row of the timing diagram 300 shows a pre-charge word line PCWL (e.g., 125a of FIG. 1 or 225 of FIG. 2A), going low. In this example, a low PCWL indicates an activation of "1." The PMOS transistor turns on when PCWL is low, which allows charging of the capacitor (if the weight is "1"). A second row shows a read word line RWL (e.g., read word line 127a of FIG. 1 or 227 of FIG. 2A). A third row shows a read bitline RBL (e.g. 118 of FIG. 1 or 221 of FIG. 2A), a fourth row shows an analog-to-digital converter (ADC) readout signal and a fifth row shows a reset signal.

For example, referring to the transistor 211 of FIG. 2A, a charge from the capacitor 223 is gradually passed on to the read bitline RBL when the read word line RWL is high.

A summed charge/current/voltage (e.g., 103 of FIG. 1 or charges summed from the bitline 221 of FIG. 2A) is passed on to a comparator or ADC (e.g., the ADC 110a of FIG. 1) in a digital weight accumulation mode, where the summed charge is converted to a digital output (e.g., digital signal/number). Alternatively, multi-column bitline output may be summed in the analog domain and then sent to an ADC. The summing of the charge may occur in an accumulation region of the timing diagram 300 and a readout from the ADC may be associated with the ADC readout region of the timing diagram 300. After the ADC readout is obtained, the reset signal discharges all of the capacitors (e.g., capacitors 123a-123i) in preparation for processing the next set of activation inputs.

Figure 4:
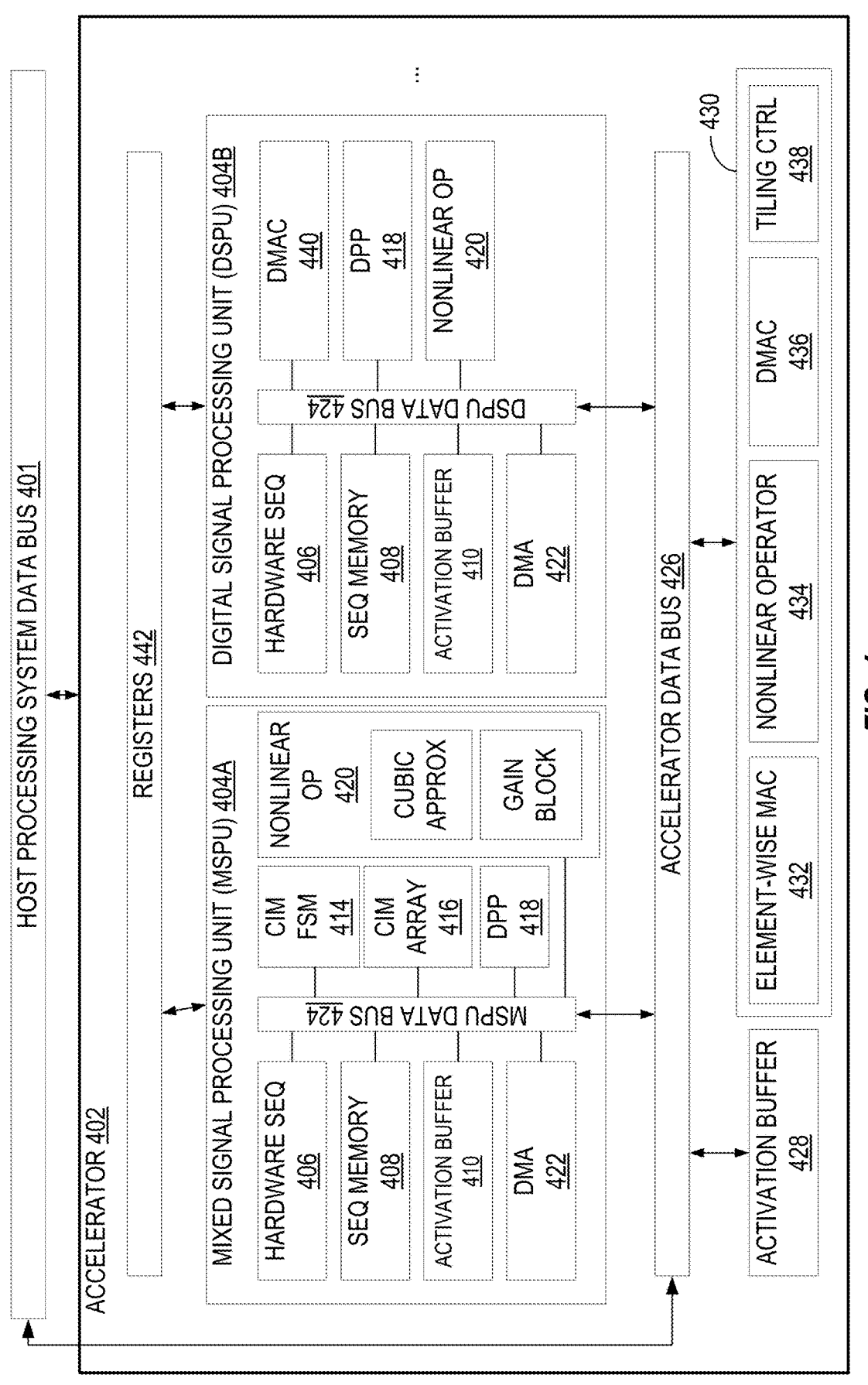
FIG. 4 depicts an example of a CIM-based machine learning task accelerator architecture, according to aspects of the present disclosure.

CIM-Based Machine Learning Task Accelerator Architecture for Supporting Advanced Machine Learning Architectures FIG. 4 depicts an example of a CIM-based machine learning task accelerator architecture 400 in accordance with various aspects described herein.

Figure 5:
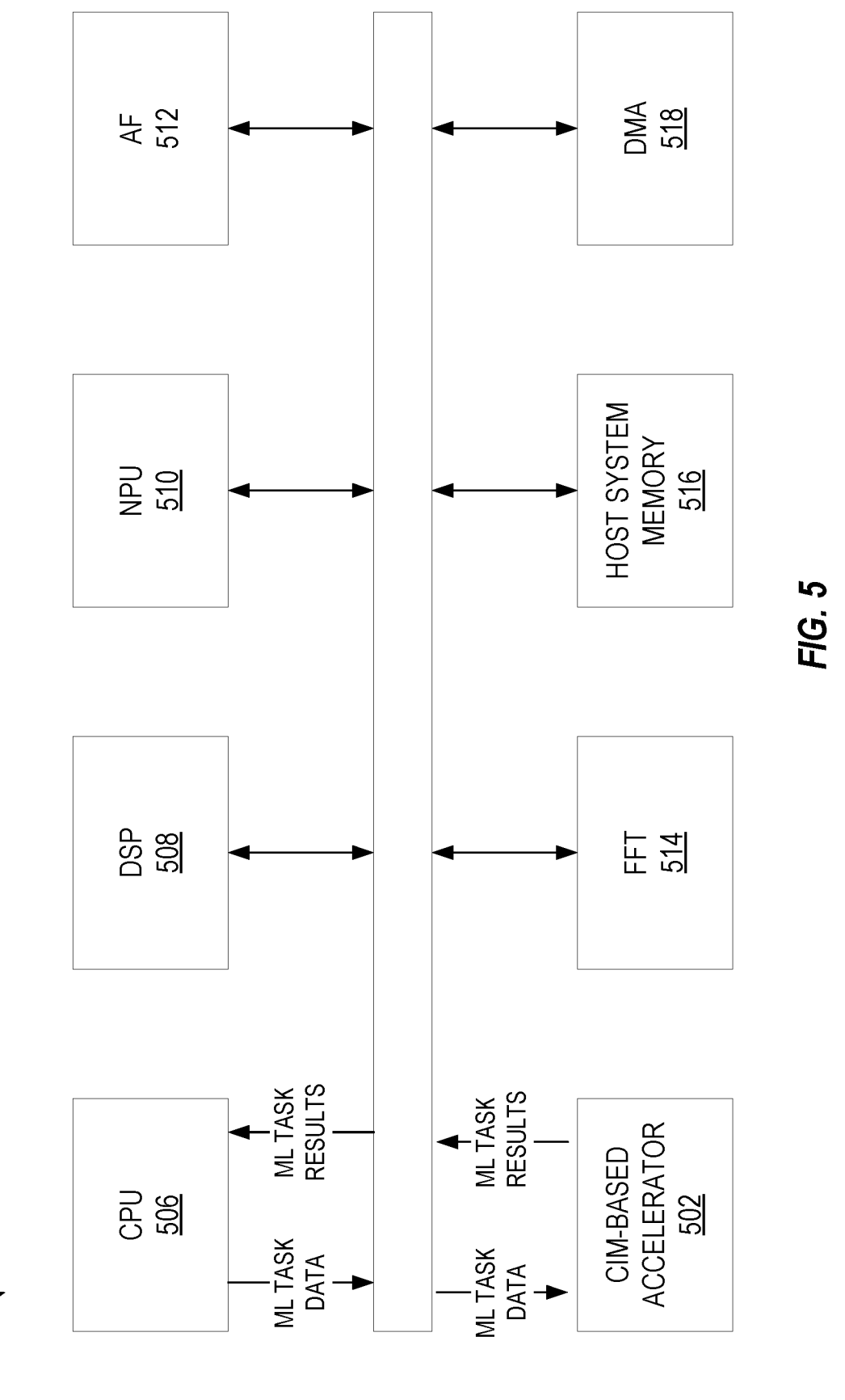
FIG. 5 depicts example aspects of a host processing system, including a CIM-based accelerator, such described with respect to FIG. 4.

In the depicted example, accelerator 402 comprises an accelerator data bus 426 connected to a host processing system data bus 401, which connects accelerator 402 to other host processing system components, such as those described in the example of FIG. 5, and others.

In the depicted example, accelerator 402 comprises a plurality of signal processing units (SPUs), including a mixed signal processing unit (MSPU) 404A configured to perform analog and digital processing of, for example, machine learning model data, and a digital signal processing unit (DSPU) 404B configured to perform digital processing of, for example, machine learning model data. Note that MSPU 404A include a CIM array 416 and CIM FSM 414, which are analog signal processing elements, thus making MSPU a "mixed signal" (digital and analog signals) processing unit, whereas DSPU 404B does not include a CIM array or CIM FSM, and thus is a digital domain signal processing unit. While a single MSPU 404A and a single DSPU 404B are depicted in accelerator 402 in FIG. 4, this is for simplicity only. Accelerator 402 may have any number of MSPUs and DSPUs subject to other design constraints, such as power, space, and the like. For example, an accelerator may have one or more MSPUs, one or more DSPUs, or some mix of MSPUs and DSPUs.

In the depicted example, MSPU 404A includes a MSPU data bus 424 connected to accelerator data bus 426, which provides a data connection to other components of accelerator 402 as well as other components of the host processing system by way of host processing system data bus 401.

MSPU 404A also includes a hardware sequencer 406 that is configured to control the sequence of operations of the computational components of MSPU 404A based on instructions stored in sequencer memory 408, thus making it a flexible sequencer block. For example, hardware sequencer 406 may control the action of the activation buffer 410, CIM finite state machine 414, CIM array 416, digital post process (DPP) block 418, and nonlinear operation block 420. The sequencer instructions may be received from the host processing system via host processing system data bus 401 and stored in the sequencer memory 408 via accelerator data bus 426 and MSPU data bus 424 under control of DMA 422.

In an alternative embodiment, sequencer 406 may be replaced by a fixed functional hardware finite state machine, which does not require instructions stored in sequencer memory 408, and thus sequencer memory 408 may likewise be omitted in such embodiments.

Further, in another alternative embodiment, accelerator 402 may include a sequencer and DMA shared with multiple SPUs, as compared to the SPU-specific sequencers and DMA in this depicted example.

MSPU 404A also includes an activation buffer 410 configured to store activation data for processing by CIM array 416. The activation data may generally include input data (e.g., pre-activation data) and weight data for processing the input data. In some embodiments, activation buffer 410 may support roll processing or instructions in order to reorder data between subsequent convolutions. In some embodiments, activation buffer 410 may be referred to as an "L1" or "local" activation buffer.

In some embodiments, glue logic (not depicted) may be included between activation buffer 410 and CIM array 416 in order to modify the activation data for processing by CIM array 416. For example, glue logic may decompress compressed activation and/or weight data by injecting zero values to the CIM at locations indicated by the compression scheme (e.g., as in the case of compressed weight formatting).

MSPU 404A also includes a direct memory access (DMA) controller 422 configured to control the loading of activation data into MSPU activation buffer 410 via MSPU data bus 424. In some cases, the activation data is loaded from accelerator activation buffer 428, which may be referred to as an "L2" or "shared" activation buffer, and which may be generally configured to store intermediate outputs from each SPU (e.g., 404A-B in this example). In this embodiment, activation buffer 428 resides on accelerator data bus 426 to reduce access energy cost by any SPU (e.g., MSPU or DSPU, such as 404A and 404B, respectively) compared to accessing data on a remote memory of the host processing system.

MSPU 404A also includes a CIM finite state machine (FSM) 414 configured to control the writing of weight and activation data to CIM array 416 from activation buffer 410. CIM FSM 414 may include multiple modes, such as weight write mode (e.g., writing weight data to CIM array 416), activation write mode, and activation read mode.

MSPU 404A also includes CIM array 416, which in some embodiments may be configured as described with respect to FIGS. 1-3. In some embodiments, the CIM array 416 may include an array of N×M nodes (or cells) that are configured for processing input data with weights stored in each node. In some embodiments, CIM array 416 may include multiple arrays (or sub-arrays or tiles) of nodes.

MSPU 404A also includes a digital post processing (DPP) block 418, which may include a variety of elements. For example, digital post processing block 418 may include one or more analog-to-digital converters, such as ADC 110a described above with respect to FIG. 1. Digital post processing block 418 may further include one or more signal modifiers, such as a gain block, bias block, shift block, pooling block, to name a few examples, which may modify an output from an analog-to-digital converter prior to the output being processed by a nonlinear operation, such as in nonlinear operation block 420. Further, digital post processing block 418 may be configured to perform analog-to-digital converter calibration. Digital post processing block 418 may further be configured to perform output bit width selection, and to handle input from another layer's output for residual connection architectures.

MSPU 404A also includes a nonlinear operation block 420 configured to perform nonlinear operations on the output from digital post processing block 418. For example, nonlinear operation block 420 may be configured to perform ReLU, ReLU6, Sigmoid, TanH, Softmax, and other nonlinear functions. In some embodiments, nonlinear operation block 420 may comprise at least a cubic approximator and a gain may be configured to perform any nonlinear operation that can be approximated up to and including cubic approximations. Generally, nonlinear operation block 420 may be configured for operation by coefficients stored in hardware registers, such as register 442.

Though not depicted in FIG. 4, in some embodiments, nonlinear operation block 420 may further receive recurrent or residual input from another layer, which can be added to the input prior to the non-linear operation performed by block 420. As another alternative, such recurrent or residual input may be added to the output of nonlinear operation block 420. Whether such input is added to the input or the output of nonlinear operation block 420 may be configured based on the type of model architecture that is being processed by an MSPU, such as MSPU 404A.

In some embodiments, nonlinear operation block 420 includes a plurality of nonlinear operation sub-blocks (not depicted). For example, a nonlinear operation sub-block may be configured to perform nonlinear operations on a subset of the total columns in CIM array 406, such as 8, 16, 32, 64, or other numbers of columns.

In some embodiments, nonlinear operation block 420 is a sub-block of digital post processing block 418, such as depicted in FIG. 4. In such embodiments, the same general configurations are possible in regards to recurrent or residual inputs, as discussed above. Generally, examples described herein with a separate nonlinear operation block may also use a nonlinear operation block that is a sub-block of a digital post-processing block.

In some cases, the output of nonlinear operation block 420 may be stored in accelerator activation buffer 428 (e.g., by way of MSPU data bus 424 and accelerator data bus 426) as an intermediate output, which may then be used by one or more other MSPUs for further processing. Further processing may then be initiated by an MSPU DMA (e.g., 422) retrieving the intermediate activation data and loading it into an MSPU activation buffer (e.g., 410).

DSPU 404B includes a digital multiply and accumulate (DMAC) block 440 instead of a CIM array (e.g., 406 in MSPU 404A). DMAC block 440 may generally include one or more (e.g., an array of) digital MAC units or circuits. In such embodiments, digital post processing block 418 may omit any analog-to-digital converters because the DMAC processing would already be in the digital domain.

While not depicted in FIG. 4, further embodiments may include MSPUs that have both a CIM array (e.g., 416) and a DMAC block (e.g., 440) within a single MSPU.

As above, FIG. 4 depicts an embodiment in which accelerator 402 includes two parallel SPUs (e.g., MSPU 404A and DSPU 404B), but in other embodiments, other numbers of SPUs may be included. In some cases, the number of SPUs may be determined based on the types of machine learning architectures that are intended to be supported by accelerator 402, target performance metrics for accelerator 402, and the like.

MSPU 404A and DSPU 404B are each connected to registers 442, which enables data communications and operations between various MSPUs and/or DSPUs (generally, signal processing units (SPUs)). In some embodiments, registers 442 include lock status registers, which ensure that multiple SPUs with data dependencies do not write over data stored in buffers (e.g., L2 activation buffer 428) before the data are consumed by other SPUs. In some embodiments, each SPU (e.g., 404A-B) has registers local to its own sequencer (e.g., 406), which are not visible to other SPU's sequencers. Accordingly, registers 442 provide an efficient mechanism for multiple SPUs to run concurrently with data flow dependencies, and provide a data efficient alternative to bus-based control.

In the depicted embodiment, accelerator 402 further includes shared processing components 430, which in this example include an element-wise MAC 432, nonlinear operation block 434, a digital MAC (DMAC) 436, and tiling control component 438. In some cases, output from an MSPU or a DSPU is stored in activation buffer 428 and then processed by one or more components of shared processing components 430. In some embodiments, one or more of shared processing components 430 may be controlled by a separate control unit (e.g., a microcontroller or MCU), a CPU or DSP such as depicted in FIG. 5, a sequencer, or a finite state machine, to name a few options.

Element-wise MAC 432 is configured to perform element-wise multiplication and accumulation operations on incoming multi-element data, such as vectors, matrices, tensors, and the like. The element-wise operation preserves the original data format, unlike a standard MAC, which takes multi-element inputs (e.g., vectors) and outputs a single value (e.g., a scalar). Element-wise operations are necessary for various types of advanced machine learning architectures, as described in more detail below. In some embodiments, element-wise multiplication may additionally or alternatively be implemented within CIM array 416 by storing a multiplicand diagonally in the array.

Nonlinear operation block 434 is configured to perform nonlinear operations on output from MSPU 404A and DSPU 404B, such as those described above with respect to nonlinear operation block 420. In some embodiments, nonlinear operation block 434 may be configured to support specific nonlinear operations based on the type of machine learning architecture being processed by accelerator 402.

Digital MAC (DMAC) block 436 is configured to perform digital multiply-and-accumulate operations on the outputs from MSPUs. For example, where an MSPU such as 404A does not include a DMAC block, the output of MSPU may be processed by DMAC block 436 as a shared resource within accelerator 402. In some cases, output from an MSPU is stored in activation buffer 428 and then processed by DMAC block 436.

Tiling control component 438 is configured to control the tiling of data across multiple CIM arrays, such as CIM arrays in a plurality of MSPUs. For example, where the input data to be processed by an MSPU is larger than the CIM array in the MSPU, tiling control component 438 may act to tile the input (e.g., weight matrices and pre-activation data)

across multiple CIM arrays of multiple MSPUs. Further, tiling control component 438 is configured to receive partial results from the MSPUs and combine it into a final result or output. In some cases, tiling control component 438 may leverage another shared processing component, such as DMAC 436, to accumulate the results. An example of tiling is described with respect to FIG. 15.

Generally, the various blocks depicted in FIG. 4 may be implemented as integrated circuits.

Example Host Processing System Including CIM-Based Accelerator 502

FIG. 5 depicts example aspects of a host processing system 500, including a CIM-based accelerator 502, such as accelerator 402 described with respect to FIG. 4.

Notably, despite being capable of independently supporting operations for advanced machine learning architectures, CIM-based accelerator 502 can also cooperate with other processors and accelerators attached to system bus 504, such as central processing unit (CPU) 506, digital signal processor (DSP) 508, neural processing unit (NPU) 510, adaptive filtering module (AF) 512, fast Fourier transform module (FFT) 514, system memory 516 (e.g., DRAM or SRAM), and direct memory access (DMA) controller 518.

For example, CIM-based accelerator 502 can process a complete neural network model or a portion of the model (e.g., one layer, several layers, multiply-and-accumulate (MAC) operations, or nonlinear operations within a layer). In some cases, CIM-based accelerator 502 may receive instructions and data to process from other processors/accelerators in host processing system 500.

For example, FIG. 5 shows CPU 506 sending machine learning task data and processing instructions (e.g., model data and input data) to CIM-based accelerator 502, which is then processed by CIM-based accelerator 502 and provided back to the system bus 504 in the form of machine learning task results. The results may be consumed by CPU 506, or other aspects of host processing system 500, such as other processors or accelerators, or stored in memory, such as host system memory 516.

CIM-Based Accelerator Support for CNN-Based Machine Learning Architectures

Figure 6:
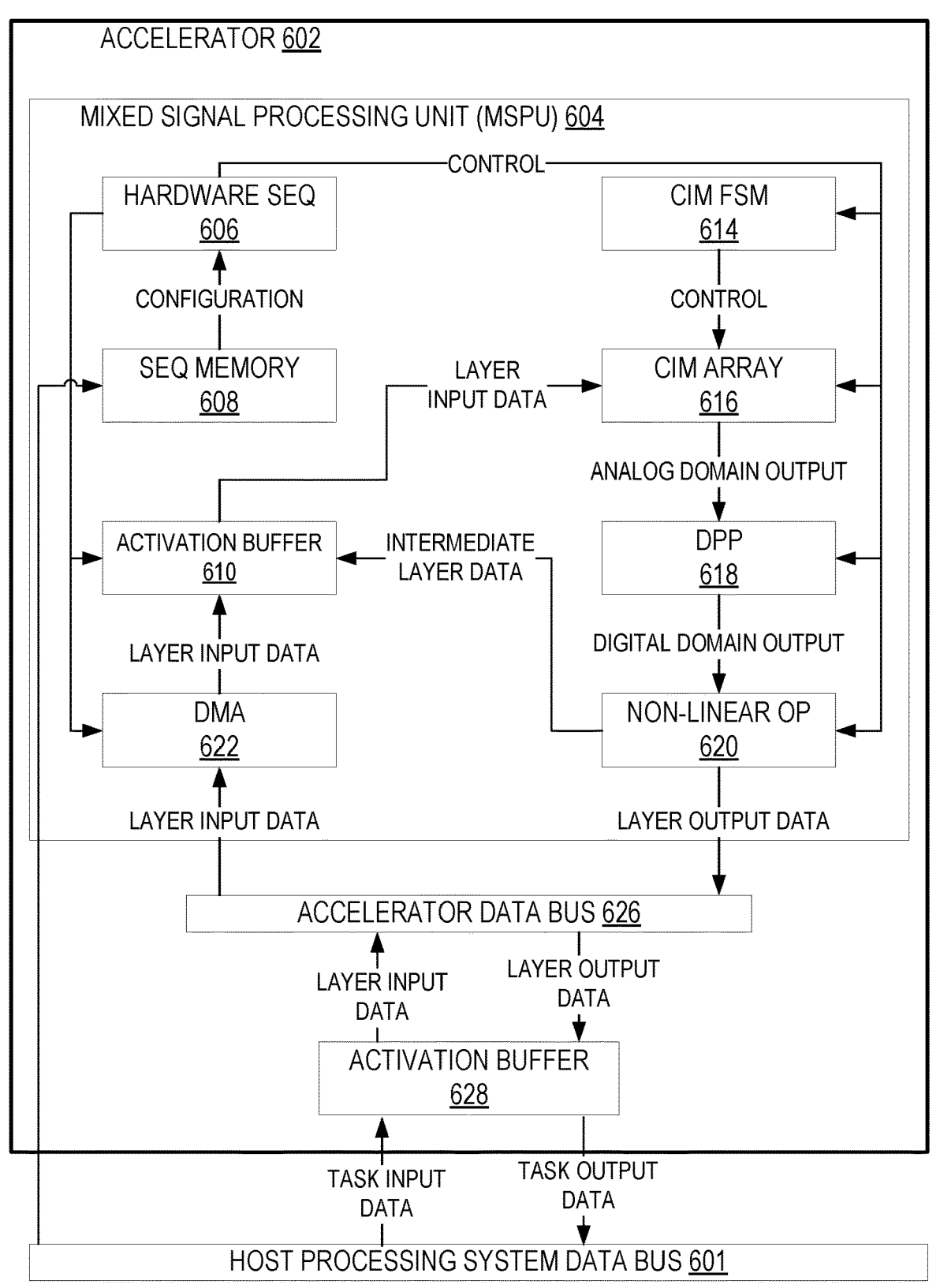
FIG. 6 depicts an example of an accelerator including a mixed signal processing unit configured to perform processing of convolutional neural network model data.

FIG. 6 depicts an example of an accelerator 602 including mixed signal processing unit (MSPU) 604, which is configured to perform processing of convolutional neural network (CNN) model data. MSPU 604 may be an example of an MSPU as described with respect to MSPU 404A in FIG. 4.

Note that various aspects of accelerator 602 are omitted for clarity, as compared to accelerator 402 in FIG. 4. For example, the MSPU data bus is removed so that functional data flows may be depicted between the various aspects of MSPU 604. These various data flows may generally be accomplished via an MSPU data bus, such as 424 described with respect to FIG. 4.

As depicted, a host processing system may provide task input data, such as machine learning model task data, which may include model data (e.g., weights, biases, and other parameters) and input data to be processed by the model, to accelerator 602 by way of host processing system data bus 601. The task input data may be initially stored in activation buffer 628 (e.g., an L2 buffer).

DMA 622 may then retrieve layer input data from activation buffer 628 by way of accelerator data bus 626 and store the data in accelerator activation buffer 610 (e.g., an L1 buffer).

Activation buffer 610 then provides layer input data, which may include weights and layer input data (e.g., pre-activation data, or intermediate activation data) to CIM array 616 for processing. In the context of a convolutional neural network, this layer input data may generally include layer input data for convolutional layers as well as fully connected layers.

CIM finite state machine 614 may control the mode of CIM array 616 so that weight data may be written to, for example, the columns of CIM array 616. For example, in the context of a convolutional neural network layer, each channel of a convolutional kernel filter may be loaded onto a single column of CIM array 616 with dimensionality filter width×filter height×filter depth (where the overall dimensionality of the filter is filter width×filter height×filter depth× number of channels). So, for example, in the case of an 8 bit weight, 8 columns are loaded per channel (in the case of a multi-bit weight).

CIM array 616 then processes the layer input data and generates analog domain output, which is provided to digital post processing (DPP) block 618. As described above, DPP block 618 may include one or more analog-to-digital converters (ADCs) to process the analog domain data and generate digital domain data.

As above, DPP block 618 may include further sub-blocks (not depicted), which perform additional functions, such as ADC calibration, biasing, shifting, pooling, output bit width selection, and other intermediate operations.

DPP block 618 provides digital domain output data to nonlinear operation block 620, which performs a nonlinear operation (such as those described above) on the data to generate layer output data.

In some cases, the output data is intermediate layer data, which may be provided directly back to activation buffer 610 for further processing within MSPU 604. In other cases, the output data may be final layer (or model) output data, which is provided back to the host processing system via accelerator data bus 626, activation buffer 628, and host processing system data bus 601 in this example (e.g., to host system memory, such as various types of random access memory (RAM)).

The various flows and processing of aspects of MSPU 604 may be directed in whole or part by hardware sequencer 606 based on instructions stored in sequencer memory 608, which may be loaded via commands from a host processing system via host processing system data bus 601.

Note that the example in FIG. 6 depicts a single MSPU (604) for simplicity, but multiple MSPUs in a single accelerator 602, and across accelerators, may process machine learning model data in parallel to improve processing system performance. As described above with respect to FIG. 4, a plurality of MSPUs may collaborate via an accelerator data bus (e.g., 426) and registers (e.g., 442) to provide parallelization of machine learning model processing operations.

Figure 7:
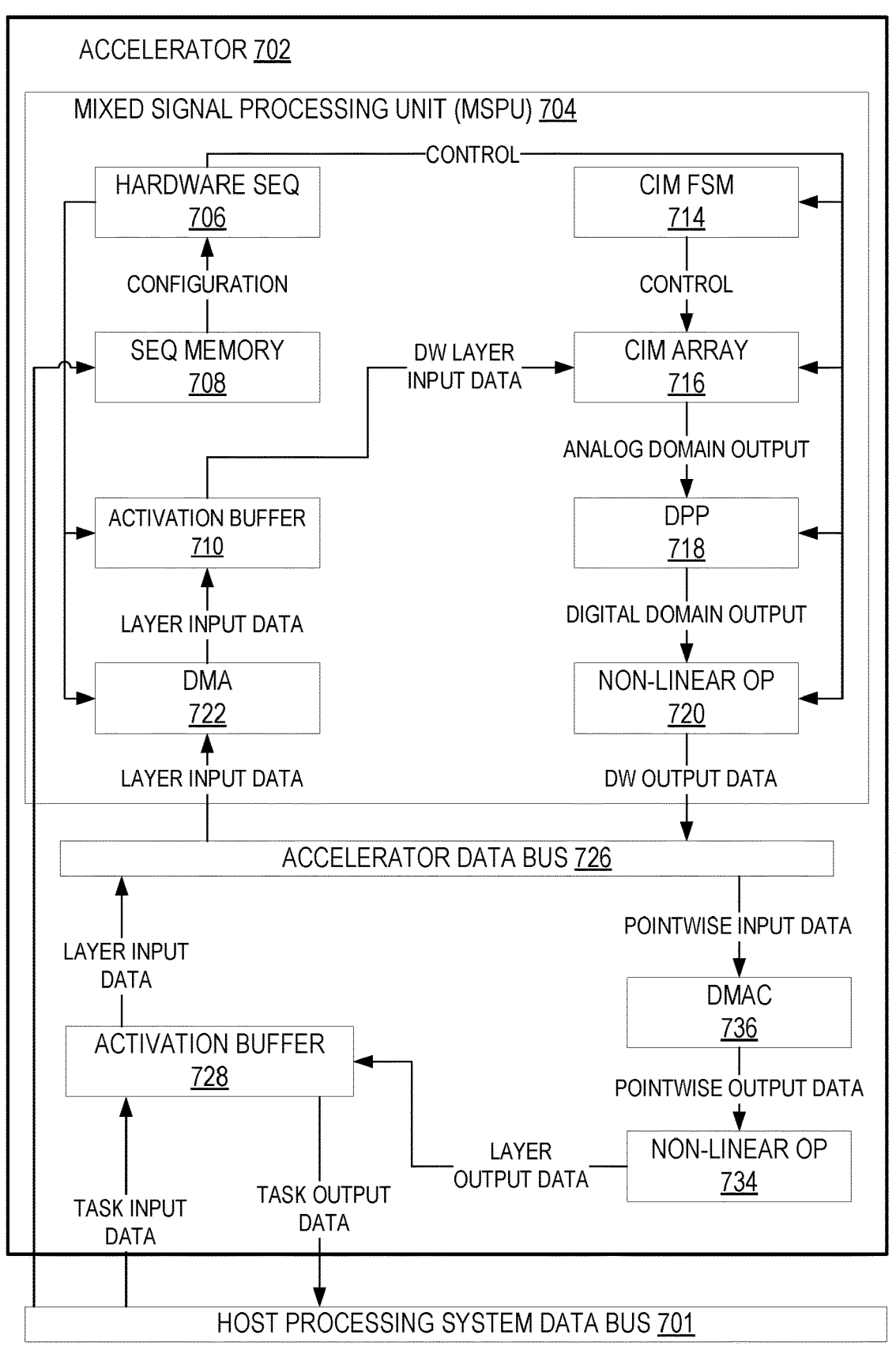
FIG. 7 depicts an example of an accelerator including a mixed signal processing unit configured to perform processing of convolutional neural network model data using a depthwise separable convolution approach.

CIM-Based Accelerator Support for Depthwise Separable CNN-Based Machine Learning Architectures FIG. 7 depicts an example of an accelerator 702 including mixed signal processing unit (MSPU) 704, which is configured to perform processing of convolutional neural network (CNN) model data using a depthwise separable convolution approach.

Note that various aspects of accelerator 702 are omitted for clarity, as compared to accelerators 404A and 404B in FIG. 4. For example, the MSPU data bus is removed so that functional data flows may be depicted between the various aspects of MSPU 704. These various data flows may generally be accomplished via an MSPU data bus, such as 424 described with respect to FIG. 4.

As depicted, a host process may provide task input data, such as machine learning model task data, which may include model data (e.g., weights, biases, and other parameters) and input data to be processed by the model, to accelerator 702 by way of host processing system data bus 701. The task input data may be initially stored in activation buffer 728 (e.g., an L2 buffer).

DMA 722 may then retrieve layer input data from activation buffer 728 by way of accelerator data bus 726 and store the data in accelerator activation buffer 710 (e.g., an L1 buffer).

Activation buffer 710 then provides layer input data, which may include weights and layer input data (e.g., pre-activation data, or intermediate activation data) to CIM array 716 for processing. In the context of a depthwise separable convolutional neural network, this layer input data may generally include depthwise layer input data for convolutional layers as well as fully connected layers.

As above, CIM finite state machine 714 may control the mode of CIM array 716 so that weight data may be written to, for example, the columns of CIM array 716.

CIM array 716 then processes the depthwise layer input data and generates analog domain output, which is provided to digital post processing (DPP) block 718. As described above, DPP block 718 may include one or more analog-to-digital converters (ADCs) to process the analog domain data and generate digital domain data.

DPP block 718 may include further sub-blocks (not depicted), which perform additional functions, such as ADC calibration, biasing, shifting, pooling, and other intermediate operations.

DPP block 718 provides digital domain output data to nonlinear operation block 720, which performs a nonlinear operation (such as those described above) on the data to generate layer output data.

In this example, the output of nonlinear operation block 720 is depthwise output data, which is provided as input data to DMAC block 736 via accelerator data bus 726.

In this example, DMAC block 736 is a shared processing component for accelerator 702, as described above with respect to share processing components 430 in FIG. 4. However, in other embodiments, a DMAC block may be included within MSPU 704 so that depthwise separable convolution operations may be completed within MSPU 704. Note that while not shown in this example for clarity, DMAC 736 may receive weight data from activation buffer 710, activation buffer 728, or from system memory directly via DMA 722.

The output of DMAC 736 is pointwise output data, which is provided to nonlinear operation block 734. As with DMAC 736 in this example, nonlinear operation block 734 is a shared processing component. However, in other embodiments where a DMAC is implemented as part of MSPU 704, then nonlinear operation block 720 may be reused in the processing flow to process the pointwise output as well as the depthwise output.

The output of nonlinear operation block 734 is depthwise separable layer output data, which is provided back to activation buffer 728. If the layer output data is intermediate layer output data, it may then be provided back to MSPU via activation buffer 728. If the layer output data is final output, then it may be provided to the host processing system 701 (e.g., to host system RAM) as task output data via activation buffer 728.

Though not depicted in this example, the output of nonlinear operation block 734 may be further processed by a digital post processing block.

The various flows and processing of aspects of MSPU 704 may be directed in whole or part by hardware sequencer 706 based on instructions stored in sequencer memory 708, which may be loaded via commands from a host processing system via host processing system data bus 701.

Note that the example in FIG. 7 depicts a single MSPU (704) for simplicity, but multiple MSPUs in a single accelerator 702, and across accelerators, may process machine learning model data in parallel to improve processing system performance. As described above with respect to FIG. 4, a plurality of MSPUs may collaborate via an accelerator data bus (e.g., 426) and registers (e.g., 442) to provide parallelization of machine learning model processing operations.

Figure 8:
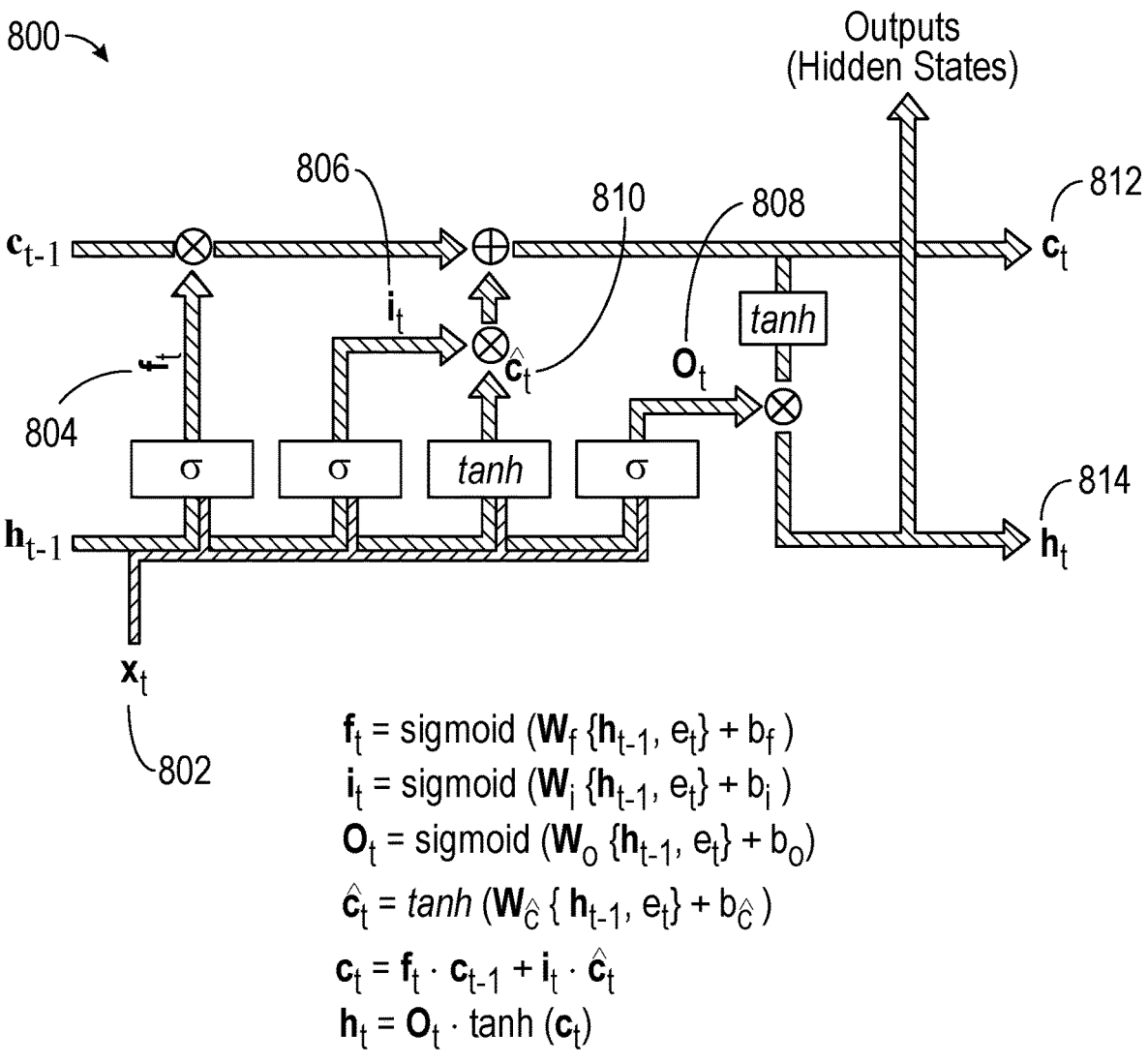
FIG. 8 depicts an example processing flow for a long short-term memory (LSTM) neural network model.

CIM-Based Accelerator Support for Multi-Layer LSTM-Based Machine Learning Architectures FIG. 8 depicts an example processing flow 800 for a long short-term memory (LSTM) neural network model.

Generally, LSTM is an artificial recurrent neural network (RNN) architecture that, unlike standard feedforward neural networks, has feedback connections. Its structure allows for processing not only static input data (e.g., an image), but also sequential input data (such as sound and video). A common LSTM unit is composed of a cell, an input gate, an output gate and a forget gate. The cell remembers values over arbitrary time intervals and the three gates regulate the flow of information into and out of the cell.

In the depicted example, $x_t$ (802) represents an input data vector, $f_t$ (804) represents a forget gate activation vector, $i_t$ (806) represents an input/update gate activation vector, $o_t$ (808) represents an output gate activation vector, $\hat{c}_t$ (810) represents a cell input activation vector, $c_t$ (812) represents a cell state vector, $h_t$ (814) represents an output value, and t represents the time step.

Note that FIG. 8 represents one example implementation of an LSTM flow, but other implementations are possible.

Figure 9:
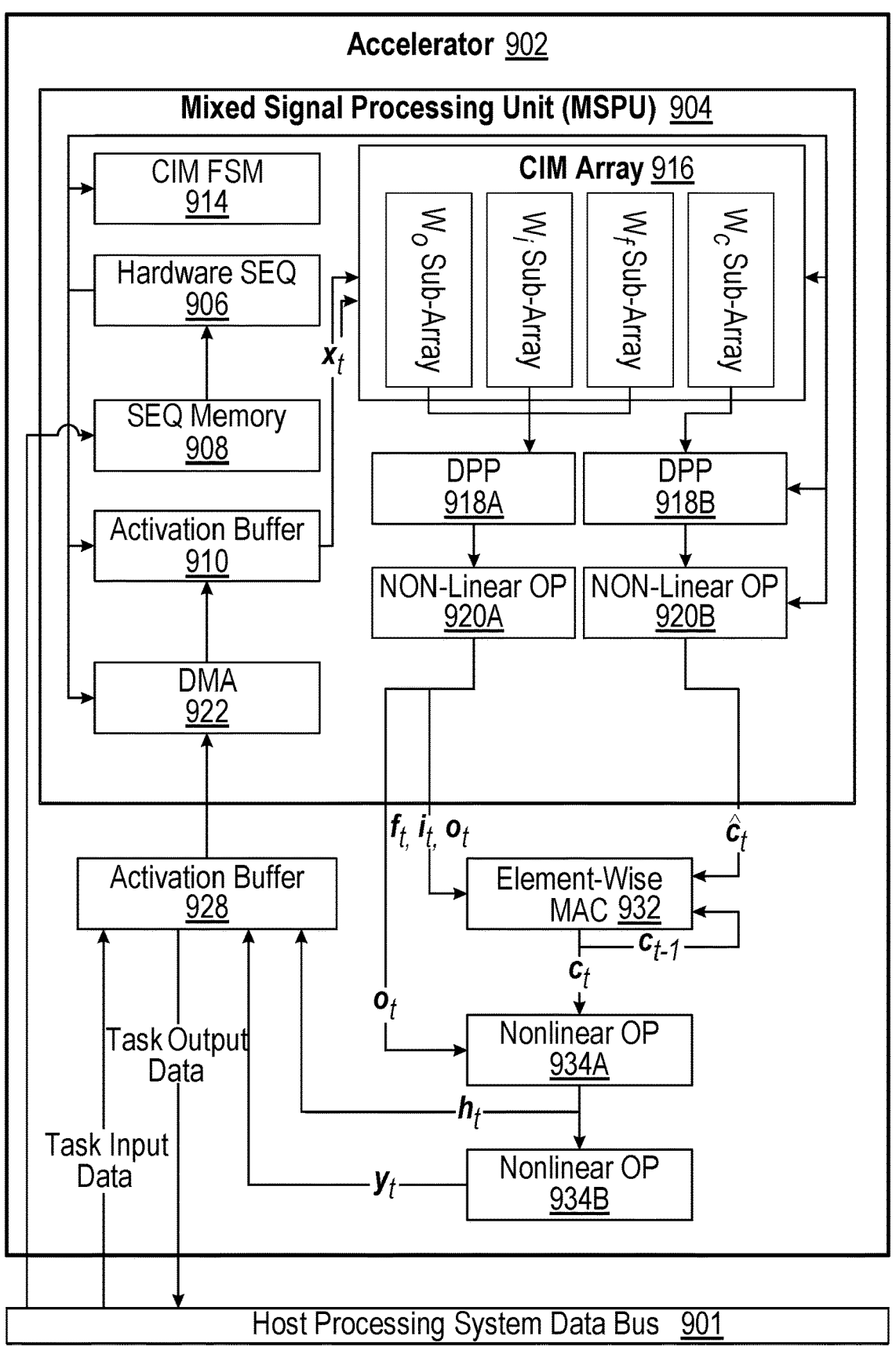
FIG. 9 depicts a mixed signal procession unit configured to support LSTM processing, such as that depicted in the flow of FIG. 8.

FIG. 9 depicts a mixed signal procession unit 904 configured to support LSTM processing. As in previous examples, various aspects depicted in FIG. 4 are omitted in FIG. 9 for clarity.

In the depicted embodiment, MSPU 904 includes a CIM array 916, which comprises a plurality of sub-arrays for different weight matrices ($W_o$, $W_i$, $W_f$, $W_c$). In this example, the sub-arrays are arranged horizontally across the CIM array, but in other embodiments the arrangements may vary.

Further in this embodiment, the sub-arrays for $W_o$, $W_i$, $W_f$ are connected to a first digital post processing block 918A, which may be configured such that each of the sub-arrays is connected to one or more analog-to-digital converters (ADCs). DPP block 918A is connected to a first nonlinear operation block 920A. In one example, nonlinear operation block 920A may be configured to perform a Sigmoid function and to output the forget gate activation vector, $f_t$, input/update gate activation vector, $i_t$, and an output gate activation vector, $o_t$.

Further in this embodiment, sub-array for $W_c$ is connected to a second digital post processing block 918B, which may also be configured with one or more ADCs. DPP block 918B is connected to a second nonlinear operation block 920B. In one example, nonlinear operation block 920B may be configured to perform a hyperbolic tangent function and to output the cell input activation vector, $\hat{c}_t$.

The outputs of nonlinear operation blocks 920A and 920B may be provided to element-wise multiply and accumulate (MAC) block 932 for element-wise vector-vector multiplication and addition. The output of element-wise MAC 932 is the cell state vector $c_t$. Further, a delay loop may provide this cell state vector back to element-wise MAC 932 as $c_{t-1}$.

The cell-state vector $c_t$ may then be processed by another nonlinear operation block 934A, which in this example is a shared processing resource (e.g., between other MSPUs, which are not depicted). In this embodiment, nonlinear operation block 934A may be configured to perform a hyperbolic tangent nonlinear operation on the cell-state vector $c_t$ to generate a hidden state vector $h_t$.

The hidden state vector $h_t$ may be provided to the activation buffer 928 to be used as input to another LSTM layer. Further, $h_t$ is provided to a second nonlinear operation block 934B, which is also a shared processing resource in this example, to generate a task output (e.g., a classification), $y_t$. In some embodiments, second nonlinear operation block 934B is configured to perform a softmax operation. The output $y_t$ is also provided to activation buffer 928, where it may be sent back to the host processing system as task output data via host processing system data bus 901.

Notably, FIG. 9 depicts just one example configuration with a single MSPU for simplicity, but others are possible. For example, rather than having all of the weight matrices share CIM array 916, weight matrices may be loaded across CIM arrays in multiple MSPUs (not depicted). In such embodiments, the CIM arrays of the multiple MSPUs may be configured to interconnect rows, and buffer logics may be configured between the MSPU CIM arrays. When using non-shared CIM arrays, the multiple gates of an LSTM layer may be processed in parallel, which increases the performance of computation of the LSTM layer.

Further, while a single layer is depicted in FIG. 9 for simplicity, multiple LSTM layers may be configured in accelerator 902. In such cases, each LSTM layer may have its own input and output buffer (or partition of a buffer). In some examples, multiple MSPUs within accelerator 902 may implement multiple layers of an LSTM neural network model, and input and output data may be passed between the MSPUs for efficient processing.

CIM-Based Accelerator Support for GRU-Based Machine Learning Architectures

Figure 10:
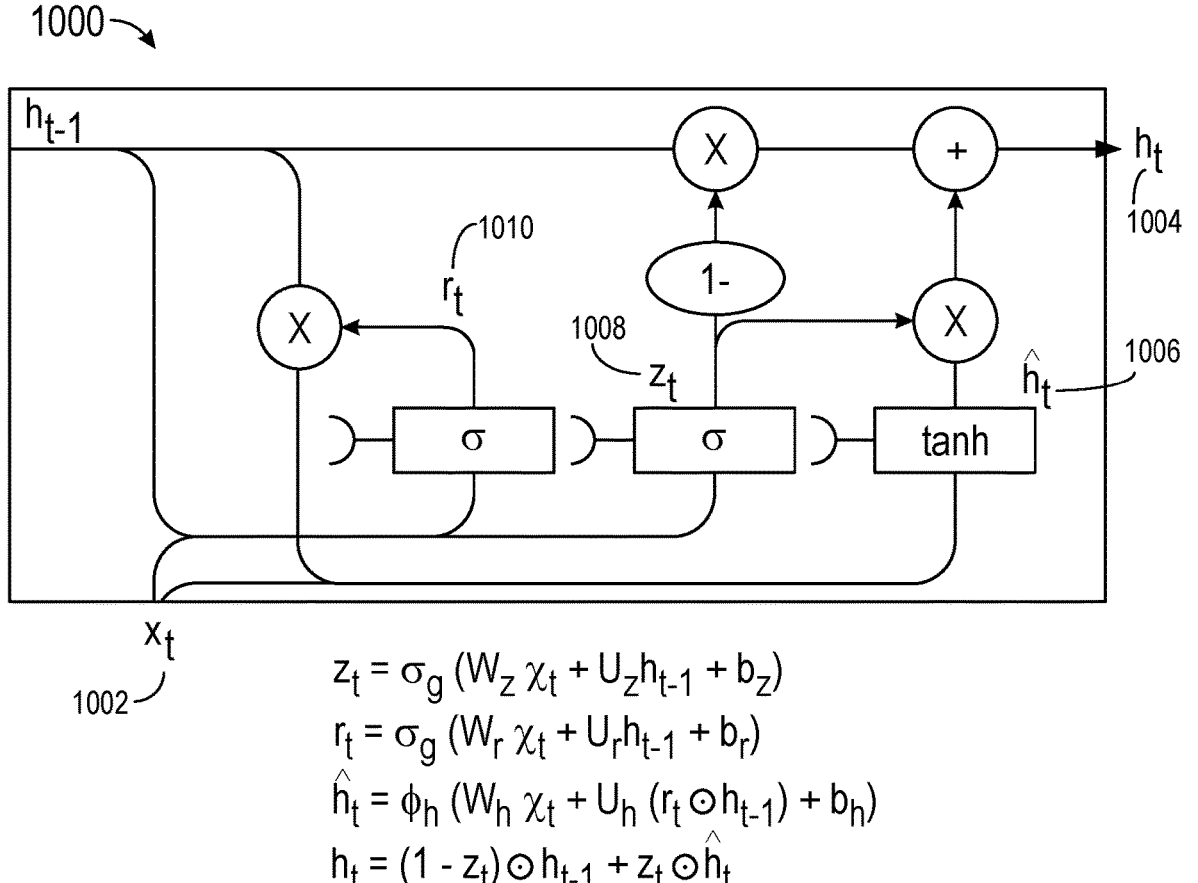
FIG. 10 depicts an example processing flow for a gated recurrent unit (GRU) aspect of a neural network model.

FIG. 10 depicts an example processing flow 1000 for a gated recurrent unit (GRU) aspect of a neural network model.

Generally, GRUs may be configured as gating mechanism in recurrent neural networks. GRUs are similar to LSTMs, but generally have fewer parameters. Note that flow 1000 is just one example, and various alternative versions of GRUs exist, such as minimal gated units.

In the depicted example, $x_t$ (1002) represents an input data vector, $h_t$ (1004) represents an output data vector, $\hat{h}_t$ (1006) represents a candidate activation vector, $z_t$ (1008) represents an update gate vector, $r_t$ (1010) represents a reset gate vector, and W, U, b represent parameter matrices and a parameter vector.

Note that FIG. 10 represents one example implementation of a GRU, but other implementations are possible.

Figure 11:
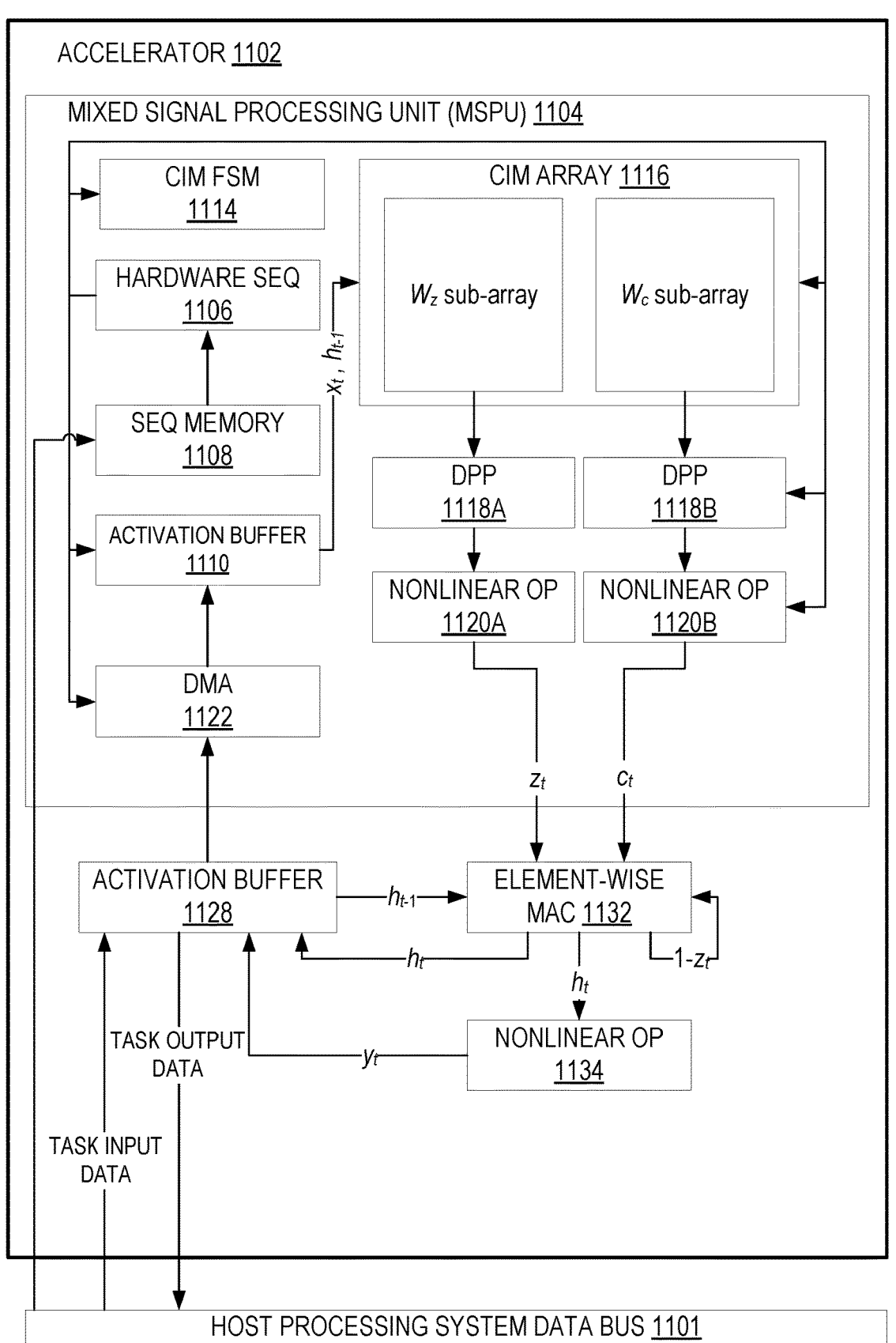
FIG. 11 depicts a mixed signal procession unit configured to support GRU processing, such as that depicted in the flow of FIG. 10.

FIG. 11 depicts a mixed signal procession unit 1104 configured to support a simplified version of the GRU processing depicted in FIG. 10, in which $z(t) = \text{sigmoid}(W_z * [h_{t-1}, x_t])$, $\hat{h}_t = \tanh(W_c * [h_{t-1}, x_t])$, and $h(t) = (1 - z_t)h_{t-1} + z_t \hat{h}_t$. As in previous examples, various aspects depicted in FIG. 4 are omitted in FIG. 11 for clarity.

In the depicted example, CIM array 1116 includes two weight matrices $W_z$ and $W_c$, with each weight matrix connected to an individual string of processing blocks, including a digital post processing block 1118A and 1118B and nonlinear operation block 1120A and 1120B, respectively.

The output of nonlinear processing blocks 1120A and 1120B are an update gate vector, $z_t$, and a cell state vector, $c_t$, which are provided to element-wise MAC 1132. In this example, element-wise MAC 1132 is configured to further provide an output vector $\hat{h}_t$ to nonlinear operation block 1134, which may be configured to perform a nonlinear operation, such as softmax, to generate $y_t$.

Notably, FIG. 11 depicts just one example configuration with a single MSPU for simplicity, but others are possible. For example, rather than having all of the weight matrices share CIM array 1116, the weight matrices may be loaded across CIM arrays in multiple MSPUs (not depicted). In such embodiments, the CIM arrays of the multiple MSPUs may be configured to interconnect rows, and buffer logics may be configured between the MSPU CIM arrays. When using non-shared CIM arrays, the multiple gates of a GRU layer may be processed in parallel, which increases the performance of computation of the GRU layer. In some embodiments, a tiling control module, such as component 438 of FIG. 4, may be configured to control the interconnection of rows between separate CIM arrays.

Further, while a single layer is depicted in FIG. 11 for simplicity, multiple GRU layers may be configured in accelerator 1102. In such cases, each GRU layer may have its own input and output buffer (or partition of a buffer). In some examples, multiple MSPUs within accelerator 1102 may implement multiple layers of a neural network model comprising a GRU layer, and input and output data may be passed between the MSPUs for efficient processing.

CIM-Based Accelerator Support for Multi-Layer RNN-Based Machine Learning Architectures

Figure 12:
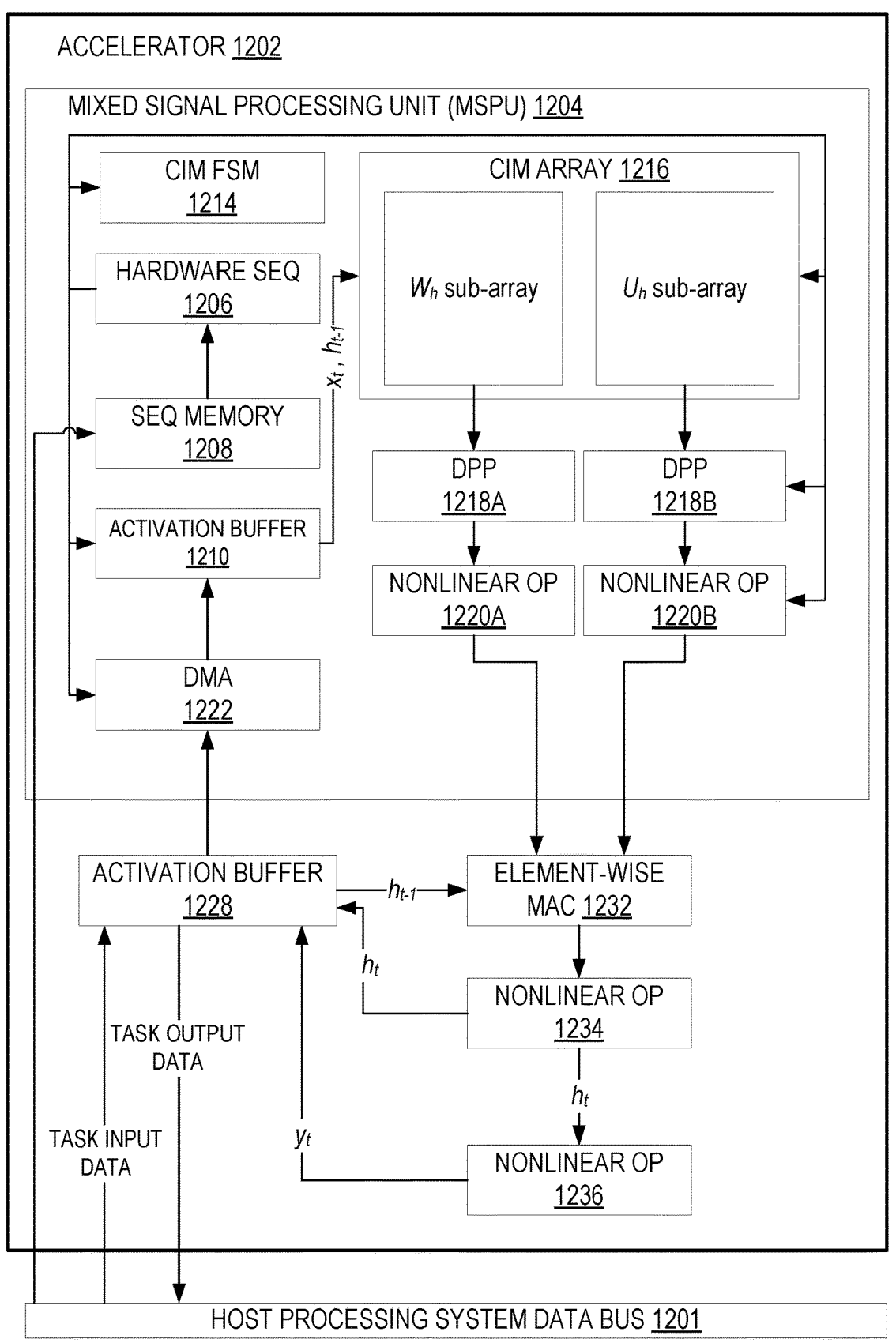
FIG. 12 depicts a mixed signal procession unit configured to support generic recurrent neural network (RNN) processing.

FIG. 12 depicts a mixed signal procession unit 1204 configured to support generic recurrent neural network (RNN) processing. As in previous examples, various aspects depicted in FIG. 4 are omitted in FIG. 12 for clarity.

In this example, activation buffer 1210 provides input vector $x_t$ and hidden layer vector $h_{t-1}$ (for the previous layer) as input to CIM array 1216, which in this example has two different sub-arrays for weight matrices $W_h$ and $U_h$. The results of the processing by CIM array 1216 flow through digital post processing blocks 1218A and 1218B and nonlinear operation blocks 1220A and 1220B to element-wise MAC 1232. The output from element-wise MAC 1232 is provided to nonlinear operation block 1234, which in this example may be configured to output the new hidden layer vector $h_t$ according to $h_t=\text{sigmoid}(x_t W_h+h_{t-1} U_h)$. Further, $h_t$ may be provided to nonlinear operation block 1236, which may be configured to generate the output vector $y_t$ according to $y_t=\text{softmax}(h_t)$. In some embodiments, nonlinear operation block 1236 may be a separate shared nonlinear operation block, whereas in other embodiments, nonlinear operation block 1234 may be reconfigured to perform the softmax operation.

CIM-Based Accelerator Support for Transformer with Attention

Figure 13:
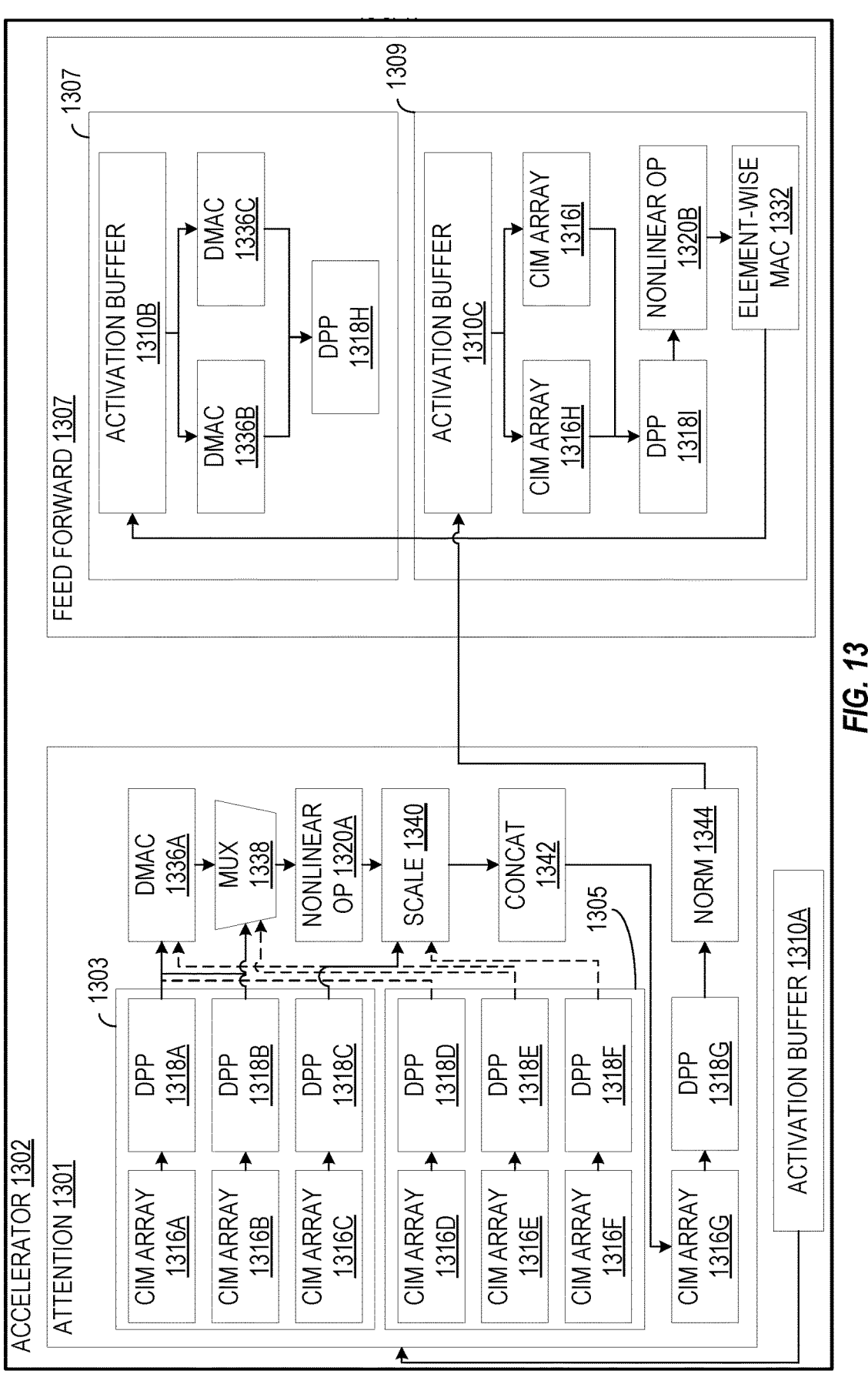
FIG. 13 depicts an accelerator configured to support transformer (e.g., encoder/decoder) processing with attention.

FIG. 13 depicts an accelerator 1302 configured to support transformer (e.g., encoder/decoder) processing with an attention mechanism. As in previous examples, various aspects depicted in FIG. 4 are omitted in FIG. 13 for clarity. In particular, only particular aspects of MSPUs are depicted; however, it is intended that the configuration in FIG. 13 may be implemented with one or more MSPUs as depicted in FIG. 4.

In the context of neural networks, an attention mechanism emphasizes the important parts of input data and deemphasizes the unimportant parts. Attention mechanisms may be implemented in several ways, including dot-product attention and multi-head attention.

A transformer model is generally a deep learning model that may be particularly well equipped for streaming data, such as in the field of natural language processing (NLP).

Unlike RNNs, such as described above, transformers do not require sequential input data be processed in a particular order, which beneficially allows for much more parallelization and thus reduced training time.

Transformer models may generally include scaled dot-product attention units. In one embodiment, for each attention unit, the transformer model learns three weight matrices; the query weights $W_Q$, the key weights $W_K$, and the value weights $W_V$. One set of weight matrices, e.g., $\{W_Q, W_K, W_V\}$, is referred to as an attention head. For each token i, the input $x_i$ (e.g., a vector) is multiplied with each of the three weight matrices to produce a query vector $q_i=x_i W_Q$, a key vector $k_i=x_i W_K$, and a value vector $v_i=x_i W_V$. The attention calculation for all tokens can be expressed as one large matrix calculation, according to:

$$\text{Attention }(Q, K, V) = \text{softmax}\left(\frac{QK^T}{\sqrt{d_k}}\right)V,$$

where $\sqrt{d_k}$ is the square root of the dimensions of the key vector.

Each encoder consists of two major components: a self-attention mechanism and a feed-forward neural network. The self-attention mechanism takes in a set of input encodings from the previous encoder and weighs their relevance to each other to generate a set of output encodings. The feed-forward neural network then further processes each output encoding individually. These output encodings are finally passed to the next encoder as its input, as well as the decoders.

Transformer models with attention heads can be used for encoding and decoding. For example, an encoder may be configured to receive positional information and embeddings of the input sequence as its input, rather than encodings. The positional information is used by the transformer to make use of the order of the sequence. A decoder generally consists of a self-attention mechanism, an attention mechanism over the encodings, and a feed-forward neural network. The decoder functions in a similar fashion to the encoder, but an additional attention mechanism is inserted which instead draws relevant information from the encodings generated by the encoder. Like the encoder, the decoder takes positional information and embeddings of the output sequence as its input, rather than encodings. The decoder may be followed by a final linear transformation and softmax layer, to produce output probabilities.

FIG. 13 depicts accelerator 1302 configured with an attention block 1301 and a feed forward block 1307.

Attention block 1301 includes two attention "heads" 1303 and 1305, which in this example are configured to work in parallel. In this example, CIM arrays 1316A-C may each be configured with an input weight matrix for an attention head, e.g., $W_Q$, $W_K$, or $W_V$, respectively. Similarly, CIM arrays 1316D-F may be configured with input weight matrices for a second attention head. Note that while this example depicts two attention heads (1303 and 1305) within attention block 1301, in other examples, other numbers of attention heads may be configured, such as 1 or more than two.

Generally, the connections for each attention head (e.g., 1303 and 1305) to other processing blocks, including DMAC 1336A, multiplexer (MUX) block 1338, nonlinear operation block 1320A, and scaling block 1340 are the same, but are distinguished in FIG. 13 by the use of solid or broken lines. In other embodiments, each attention head (e.g., 1303 and 1305) may include individual subsequent processing blocks, such as a DMAC block configured for each attention head, instead of shared between the attention heads.

DMAC block 1336A is configured to perform vector multiplications, including $QK^T$ in the attention equation, above.

MUX block 1338 is configured to select attention output of each head (e.g., 1304 and 1305) so that scaling and concatenation can be performed on each of them.

Nonlinear operation block 1320A is configured to perform an attention calculation, such as to perform a softmax function based on the input to nonlinear operation block 1320A.

Scaling block 1340 is configured to perform a scaling operation based on the model size, including $\sqrt{d_k}$ in the attention equation, above. For example, in one embodiment $d_k=64$.

Concatenation block 1342 is configured to concatenate the multi-headed attention output (e.g., output from attention heads 1303 and 1305) prior to matrix multiplication (e.g., in block 1316G) to reduce the output dimensionality back to that of the input.

Normalization block 1344 is configured to perform normalization of attention output to improve performance. For example, normalization block 1334 can calculate the mean and variance of the block input and normalize it to a set mean (e.g., 0) and set variance (e.g., 1) and then scale the output to the set mean and variance, similar to a batch normalization process.

The output of attention block 1301 is a normalized encoding output, which is provided as input to feed forward block 1307, which is configured to implement two fully-connected layers according to $N(x)=\max(0, xW_1+b_1) W_2+b_2$.

Block 1307 is an example block configured to implement feed forward fully-connected network layers with DMACs 1336B and 1336C. For example, DMAC 1336B may be configured to perform the $xW_1+b_1$ calculations in the FFN equation and DMAC 1336C may be configured to perform the calculations with $W_2$ and $b_2$ in the FFN equation. DPP block 1318H may then process the outputs from DMAC blocks 1336B and 1336C.

Block 1309 is an example block configured to feed forward fully-connected network layers with CIM arrays 1316A and 1316B. For example, CIM array 1316H may be configured to perform the $xW_1+b_1$ calculation and CIM array 1316I may be configured to perform the calculations in the FFN equation with $W_2$ and $b_2$. DPP block 1318I may then process the outputs from CIM arrays 1316H and 1316I and provide that output to non-linear operation block 1320B.

Note that in some embodiments, residual input may be added in DPP block 1318G, such as described below with respect to FIG. 14.

Example Digital Post Processing Block

Figure 14:
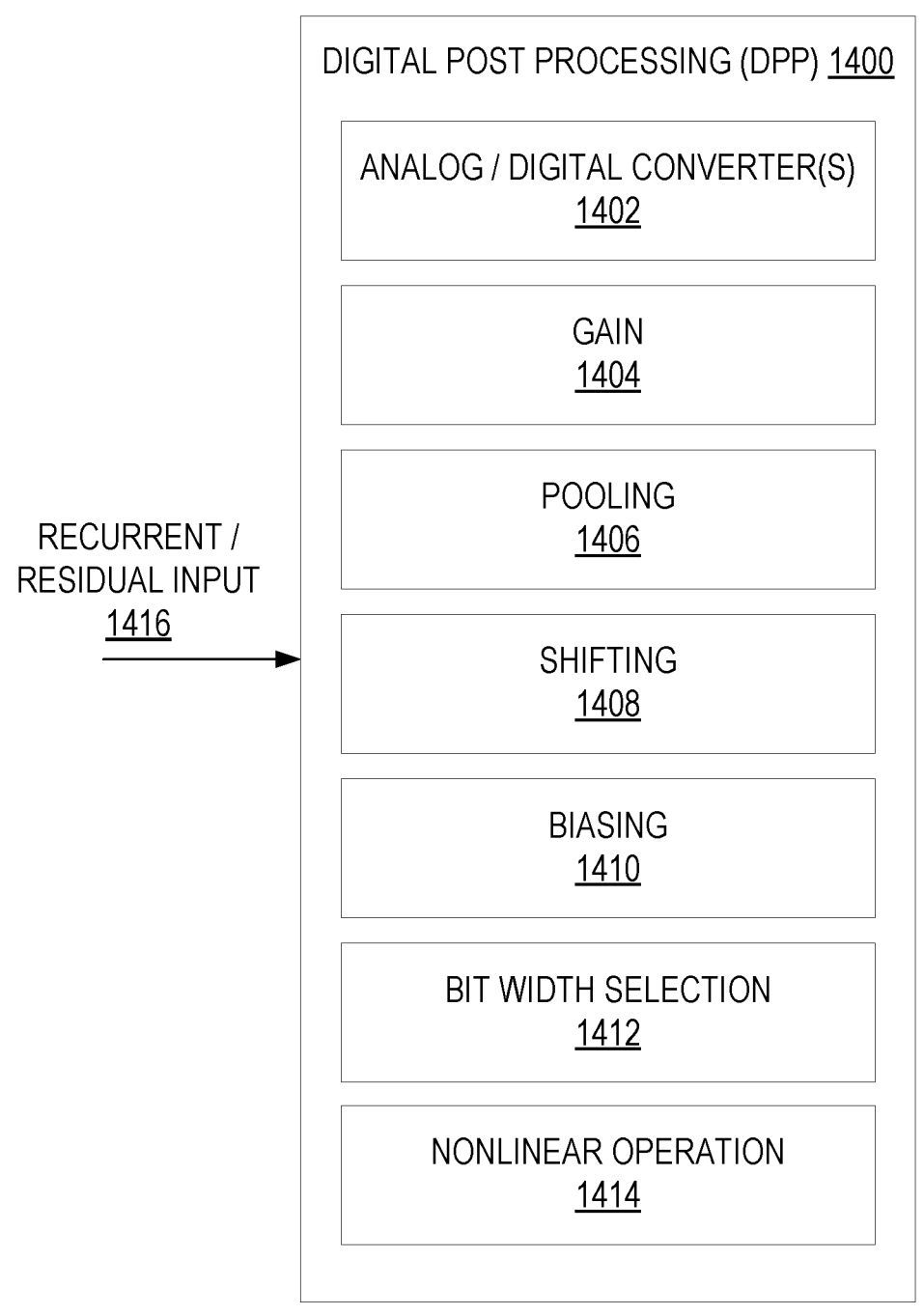
FIG. 14 depicts an example of a digital post processing block.

FIG. 14 depicts an example of a digital post processing (DPP) block 1400.

In the depicted embodiment, DPP block 1400 includes various sub-blocks 1402-1416. Note that the order of the blocks 1402-1416 is not intended to denote any specific order of processing. Further, while DPP block 1400 includes various sub-blocks in the depicted embodiment, in other embodiments, DPP blocks may include fewer sub-blocks, other sub-blocks, or additional sub-blocks. For example, as described above, nonlinear operation 1414 may be omitted where an external nonlinear operation block is implemented.

DPP block 1400 includes analog-to-digital converter(s) (ADCs) 1402, which may generally include one or more ADCs configured to convert analog domain signals (e.g., output from a CIM array) to digital domain signals.

DPP block 1400 further includes gain block 1404, which is configured to scale the ADC output and add bias, as in a prescaling block.

DPP block 1400 further includes pooling block 1406, which is configured to perform pooling operations. Pooling, such as max or average pooling, may generally be used for downsampling or otherwise reducing the dimensionality of input data.

DPP block 1400 further includes shifting block 1408, which is configured to scale and add gain to the pooling output from block 1406, in this example.

DPP block 1400 further includes biasing block 1410, which is configured to add bias to the output of shifting block 1408. Thus, shifting block 1408 and biasing block 1410 may act together as a post-scaling block for pooled output from pooling block 1406 in this example.

DPP block 1400 further includes bit width selection block 1412, which is configured to select the output bitwidth, e.g., from 1 to 8 bit, for output packing in a memory (e.g., an SRAM).

DPP block 1400 further includes nonlinear operation block 1414, which is configured to perform various nonlinear operations as described herein. For example, nonlinear operation block 1414 may be configured to perform sigmoid or logistic functions, TanH or hyperbolic tangent functions, rectified linear unit (ReLU) functions, leaky ReLU, parametric ReLU, Softmax, and swish, to name a few examples.

As depicted, DPP block 1400 may be configured to receive residual or recurrent input, such as data from a residual layer in a residual neural network (e.g., a "ResNet" or "SkipNet") or data from a recurrent layer in a recurrent neural network (RNN). In various embodiments, this sort of input data may be input to a data stream being processed before and/or after a nonlinear operation, such as may be performed by nonlinear operation block 1414.

CIM Support for Layer Tiling

Relatively larger layers in various machine learning model architectures, including in various configurations of those described herein, may not always be able to be processed by a single CIM array. As described above, in some cases, physically separate CIM arrays in an accelerator may be physically tied together to increase the size of the effective CIM array. However, physically connecting CIM arrays to increase the effective size may not always be preferred depending on the number of CIM arrays configured in an accelerator, the architecture being configured for the accelerator, and the size of the layer. In order to address this, a layer may be virtually spread over multiple CIM arrays, which may also be spread over one or more accelerators. In such a configuration, partial processing output from the virtually connected CIM arrays may be recombined to form a final output. Further, in some configurations, a single smaller CIM array may create partial processing output in different time slots, wherein each time slot acts as a part of a larger, virtual CIM array.

Array utilization may be considered for efficient mapping of processing across one or more CIM arrays (including one or more CIM array mapped to different processing time slots). Fine-grained tiling can help power savings by disabling unused tiles. However, model error may be introduced since the partial sum from each array are scaled and quantized version of the ideal larger dimension array. In such cases, dimension error aware training may be used to increase performance.

Figure 15:
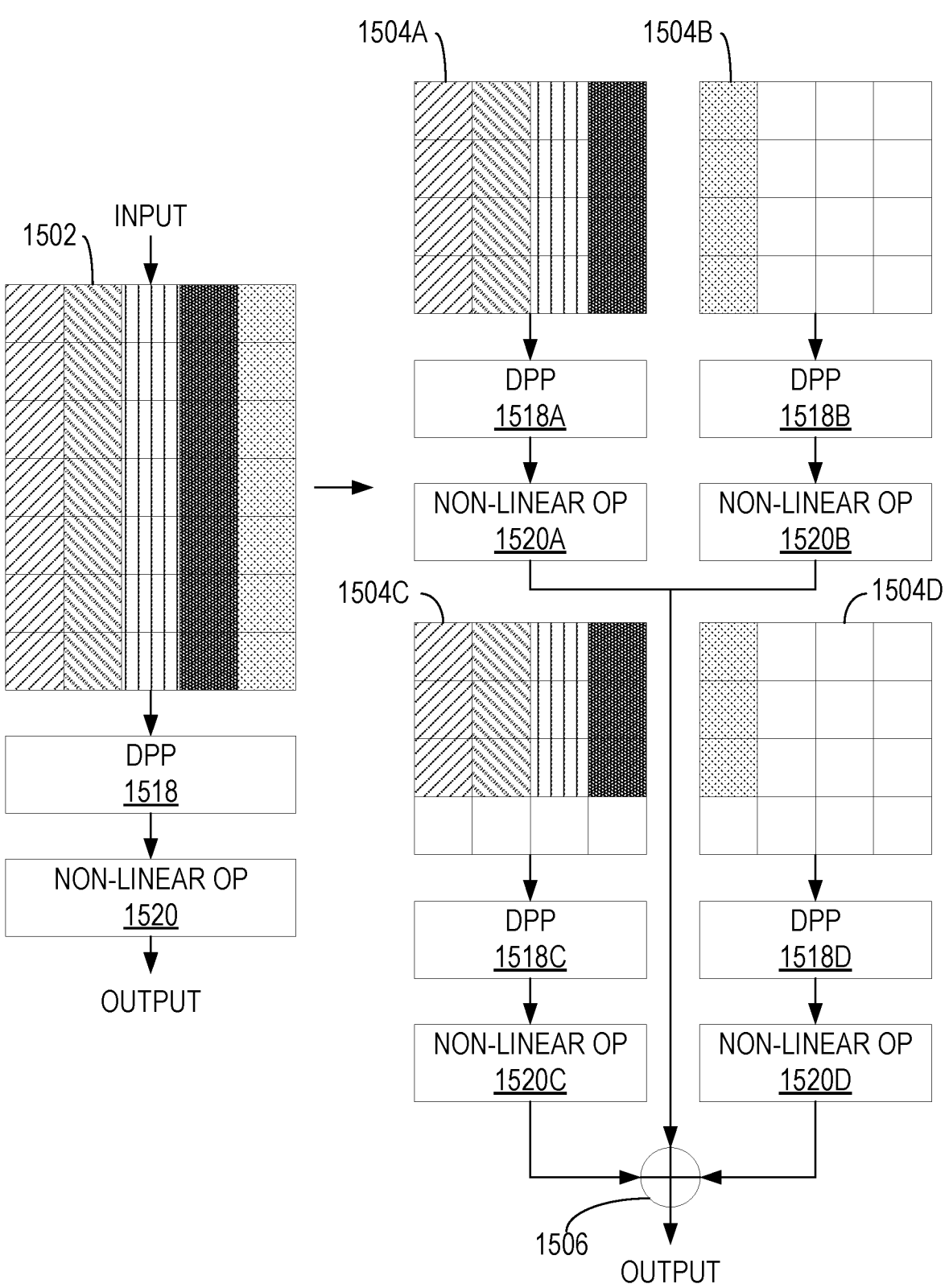
FIG. 15 depicts an example of tiling with a plurality of CIM arrays.

FIG. 15 depicts an example of tiling with a plurality of CIM arrays. In the depicted example, virtual CIM array 1502, which may correspond to the required size of an input layer for a machine learning model.

Virtual CIM array 1502 may be implemented with physically smaller CIM arrays 1504A-D as depicted. For example, the 7 (row)×5 (column) input data array may be processed using four 4×4 CIMS 1504A-D. Note that in FIG. 15, the shading of various input data elements is used as a visual indicator to show how the original input data may be processed by the individual CIM arrays 1504A-D.

The partial operation results from each individual CIM array 1504A-D, e.g., partial summations in this example, may be processed by digital post processing blocks 1518A-D, respectively, and then a nonlinear operation may be performed by nonlinear operation blocks 1520A-D, respectively, prior to the partial outputs being combined in accumulator 1506 in order to generate the equivalent output of a larger virtual CIM array 1502. While individual digital post processing blocks 1518A-D and nonlinear operation blocks 1520A-D are depicted in this example, a shared digital post processing block and a shared nonlinear operation block may be used in other embodiments.

In some embodiments, tiling may be controlled by an element of an accelerator, such as tiling control 438 of FIG. 4.

Example Method of Processing Machine Learning Model Data with an Accelerator

Figure 16:
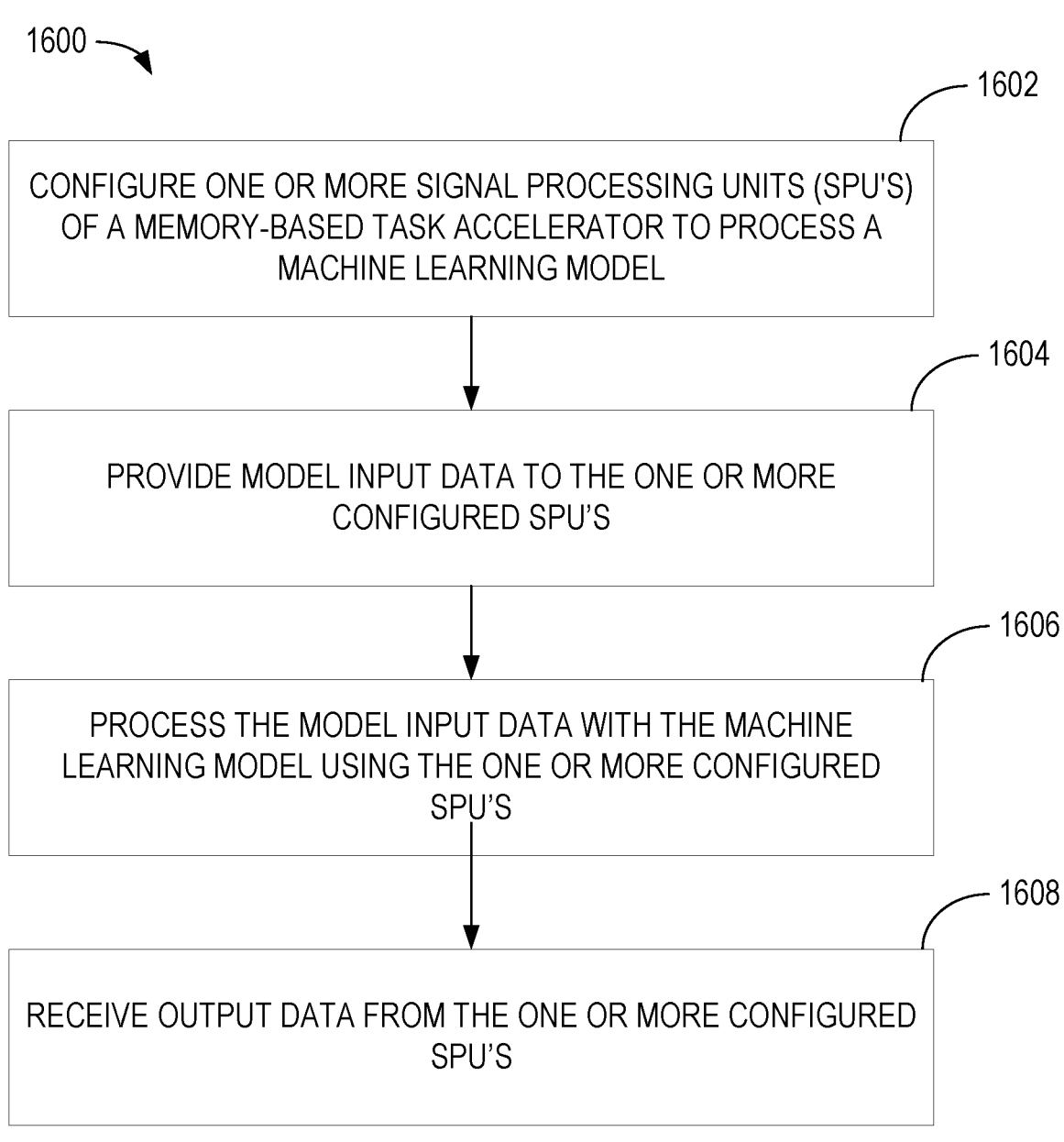
FIG. 16 depicts an example method of processing machine learning model data with a machine learning task accelerator.

FIG. 16 depicts an example method of processing machine learning model data with a machine learning task accelerator, such as described herein with respect to FIGS. 4-15.

Method 1600 beings at step 1602 with configuring one or more signal processing units (SPUs) of the machine learning task accelerator to process a machine learning model. In some embodiments, the one or more SPUs may include one or more mixed signal processing units (MSPUs) (e.g., 404A in FIG. 4) and/or one or more digital signal processing units (DSPUs) (e.g., 404B in FIG. 4).

In some embodiments of method 1600, the one or more SPUs are configured for different types of machine learning model architectures, such as those discussed above with respect to FIGS. 6-13. In some embodiments of method 1600, the configuration of the one or more SPUs is in accordance with instructions provided by a host processing system, which are stored, at least in part, in the hardware sequencer memory in one or more of the SPUs.

Method 1600 then proceeds to step 1604 with providing model input data to the one or more configured SPUs.

In some embodiments, providing the model input data to the one or more configured SPUs includes applying the input data to rows of a CIM array of one or more of the MSPUs, such as discussed with respect to FIGS. 1-3.

In some embodiments, the input data may be modified by glue logic, for example, to decompress the input data. In some embodiments, the input data may comprise image data, video data, sound data, voice data, text data, or other types of structured or unstructured data.

Method 1600 then proceeds to step 1606 with processing the model input data with the machine learning model using the one or more configured SPUs.

Method 1600 then proceeds to step 1608 with receiving output data from the one or more configured SPUs. In some embodiments, the output data may relate to a task for which the machine learning model was trained, such as classification, regression, or other types of inferencing.

In some embodiments, method 1600 further includes writing weight data to the one or more SPUs, for example, to one or more columns of the one or more MSPUs such as discussed with respect to FIGS. 1-3. In some embodiments, each weight of a convolutional neural network filter may be stored in a single column if the weight is binary, or else in a plurality of adjacent columns if the weights are multi-bit.

In some embodiments, method 1600 further includes providing the output data to a host processing system.

In some embodiments of method 1600, each of the one or more SPUs may comprise one or more of the elements described above with respect to FIG. 4.

In some embodiments of method 1600, the machine learning model comprises a convolutional neural network model. In some embodiments of method 1600, processing the model input data with the machine learning model includes: performing a depthwise convolution operation of a depthwise separable convolution operation with a CIM circuit of the at least one or more MSPUs; and performing a pointwise convolution operation of the depthwise separable convolution operation with a DMAC circuit, such as described with respect to FIG. 7.

In some embodiments of method 1600, the machine learning model comprises a recurrent neural network model, such as described above with respect to FIG. 12.

In some embodiments of method 1600, the machine learning model comprises at least one long short-term memory (LSTM) layer, such as described above with respect to FIGS. 8-9.

In some embodiments of method 1600, the machine learning model comprises at least one gated recurrent unit (GRU) layer, such as described above with respect to FIGS. 10-11.

In some embodiments of method 1600, the machine learning model comprises a transformer neural network model comprising an attention component and a feed forward component, such as described above with respect to FIG. 13.

In some embodiments, method 1600 further includes loading weight data for a single layer of the machine learning model into at least two separate CIM circuits of two separate MSPUs of the one or more SPUs; receiving partial output from the two separate MSPUs; and generating final output based on the received partial outputs, such as described above with respect to FIG. 14.

Note that method 1600 is just one example method, and many other methods are possible consistent with the various methods discussed herein. Further, other embodiments may have more or fewer steps as compared to the example described with respect to FIG. 16.

Example Processing System

Figure 17:
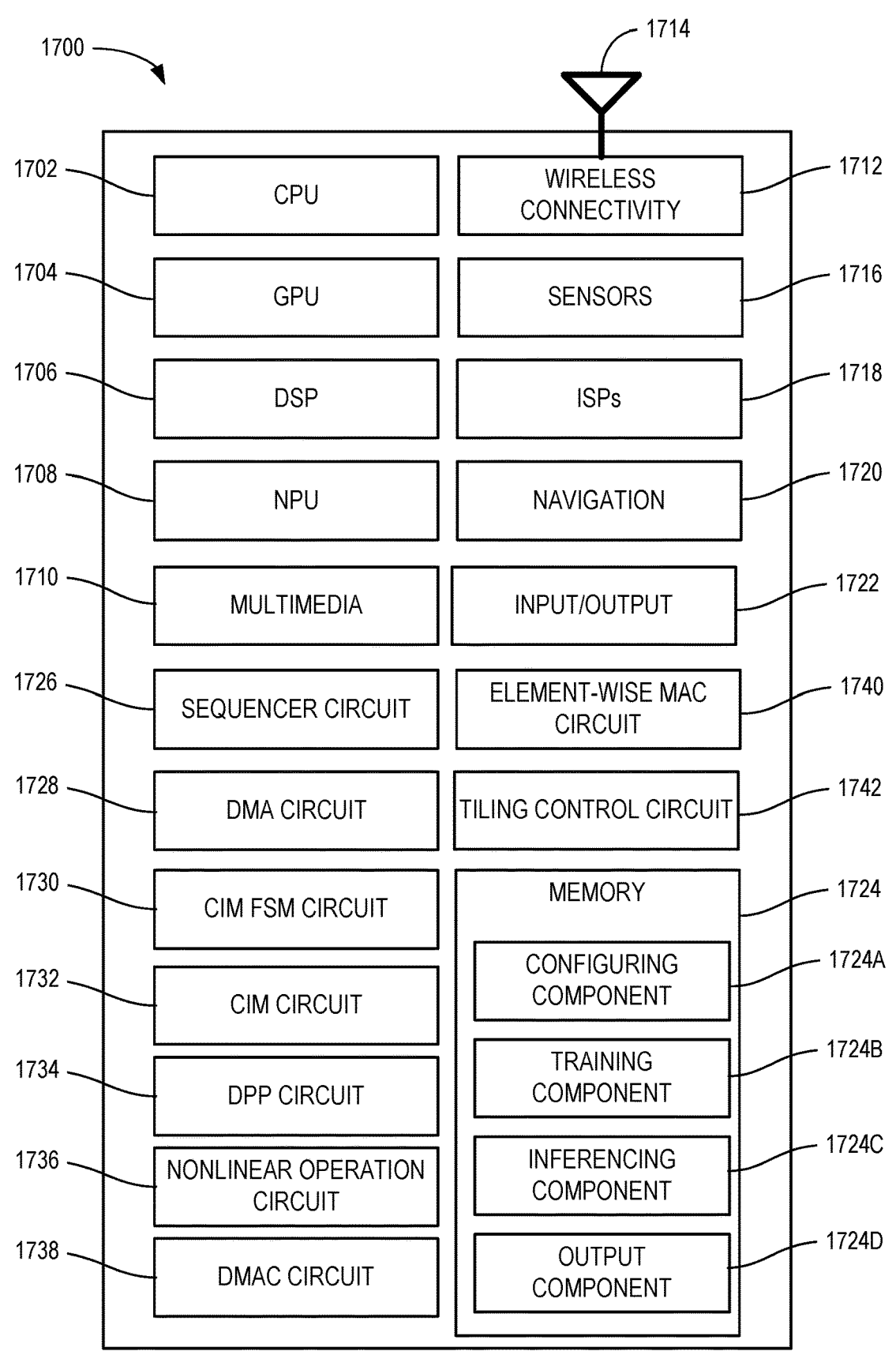
FIG. 17 depicts an example processing system that may be configured to perform the methods described herein.

FIG. 17 depicts an example processing system 1700 that may be configured to perform the methods described herein, such with respect to FIGS. 6-15.

Processing system 1700 includes a central processing unit (CPU) 1702, which in some examples may be a multi-core CPU. Instructions executed at the CPU 1702 may be loaded, for example, from a program memory associated with the CPU 1702 or may be loaded from a memory partition 1724.

Processing system 1700 also includes additional processing components tailored to specific functions, such as a graphics processing unit (GPU) 1704, a digital signal processor (DSP) 1706, a neural processing unit (NPU) 1708, a multimedia processing unit 1710, and a wireless connectivity component 1712.

An NPU, such as 1708, is generally a specialized circuit configured for implementing all the necessary control and arithmetic logic for executing machine learning algorithms, such as algorithms for processing artificial neural networks (ANNs), deep neural networks (DNNs), random forests (RFs), kernel methods, and the like. An NPU may sometimes alternatively be referred to as a neural signal processor (NSP), a tensor processing unit (TPU), a neural network processor (NNP), an intelligence processing unit (IPU), or a vision processing unit (VPU).

NPUs, such as 1708, may be configured to accelerate the performance of common machine learning tasks, such as image classification, machine translation, object detection, and various other tasks. In some examples, a plurality of NPUs may be instantiated on a single chip, such as a system on a chip (SoC), while in other examples they may be part of a dedicated machine learning accelerator device.

NPUs may be optimized for training or inference, or in some cases configured to balance performance between both. For NPUs that are capable of performing both training and inference, the two tasks may still generally be performed independently.

NPUs designed to accelerate training are generally configured to accelerate the optimization of new models, which is a highly compute-intensive operation that involves inputting an existing dataset (often labeled or tagged), iterating over the dataset, and then adjusting model parameters, such as weights and biases, in order to improve model performance. Generally, optimizing based on a wrong prediction involves propagating back through the layers of the model and determining gradients to reduce the prediction error.

NPUs designed to accelerate inference are generally configured to operate on complete models. Such NPUs may thus be configured to input a new piece of data and rapidly process it through an already trained model to generate a model output (e.g., an inference).

In some embodiments, NPU 1708 may be implemented as a part of one or more of CPU 1702, GPU 1704, and/or DSP 1706.

In some embodiments, wireless connectivity component 1712 may include subcomponents, for example, for third generation (3G) connectivity, fourth generation (4G) connectivity (e.g., 4G LTE), fifth generation connectivity (e.g., 5G or NR), Wi-Fi connectivity, Bluetooth connectivity, and other wireless data transmission standards. Wireless connectivity processing component 1712 is further connected to one or more antennas 1714.

Processing system 1700 may also include one or more sensor processing units 1716 associated with any manner of sensor, one or more image signal processors (ISPs) 1718 associated with any manner of image sensor, and/or a navigation processor 1720, which may include satellite-based positioning system components (e.g., GPS or GLONASS) as well as inertial positioning system components.

Processing system 1700 may also include one or more input and/or output devices 1722, such as screens, touch-sensitive surfaces (including touch-sensitive displays), physical buttons, speakers, microphones, and the like.

In some examples, one or more of the processors of processing system 1700 may be based on an ARM or RISC-V instruction set.

Processing system 1700 also includes various circuits in accordance with the various embodiments described herein. In particular, processing system includes direct memory access (DMA) circuit 1728, CIM finite state machine (FSM) circuit 1730, compute-in-memory (CIM) circuit 1732, digital post processing circuit 1734, nonlinear operation circuit

1736, digital multiplication and accumulation (DMAC) circuit 1738, element-wise multiplication and accumulation circuit 1740, and tiling control circuit 1742. One or more of the depicted circuits, as well as others not depicted, may be configured to perform various aspects of the methods described herein.

Processing system 1700 also includes memory 1724, which is representative of one or more static and/or dynamic memories, such as a dynamic random access memory, a flash-based static memory, and the like. In this example, memory 1724 includes computer-executable components, which may be executed by one or more of the aforementioned components of processing system 1700.

In particular, in this example, memory 1724 includes configuring component 1724A, training component 1724B, inferencing component 1724C, and output component 1724D. One or more of the depicted components, as well as others not depicted, may be configured to perform various aspects of the methods described herein.

Generally, processing system 1700 and/or components thereof may be configured to perform the methods described herein.

Notably, in other embodiments, aspects of processing system 1700 may be omitted, such as where processing system 1700 is a server computer or the like. For example, multimedia component 1710, wireless connectivity 1712, sensors 1716, ISPs 1718, and/or navigation component 1720 may be omitted in other embodiments. Further, aspects of processing system 1700 may be distributed, such as training a model and using the model to generate inferences, such as user verification predictions.

Further, in other embodiments, various aspects of methods described above may be performed on one or more processing systems.

Example Clauses

Implementation examples are described in the following numbered clauses:

Clause 1: A machine learning task accelerator, comprising: one or more mixed signal processing units (MSPUs), each respective MSPU of the one or more MSPUs comprising: a compute-in-memory (CIM) circuit; a local activation buffer connected to the CIM circuit and configured to store activation data for processing by the CIM circuit; one or more analog to digital converters (ADCs) connected to the CIM circuit and configured to convert analog computation result signals from the CIM circuit to digital computation result data; a first nonlinear operation circuit connected to one or more outputs of the one or more ADCs and configured to perform nonlinear processing on the digital computation result data; a hardware sequencer circuit configured to execute instructions received from a host system and control operation of the MSPU; and a local direct memory access (DMA) controller configured to control access to a shared activation buffer; a digital multiplication and accumulation (DMAC) circuit connected to the one or more MSPUs and configured to perform multiplication and accumulation operations on activation data output from one or more of the one or more MSPUs; a digital element-wise multiplication and accumulation circuit connected to the one or more MSPUs and configured to perform element-wise multiplication and element-wise accumulation operations on activation data output from one or more of the one or more MSPUs; and a second nonlinear operation circuit connected to the one or more MSPUs.

Clause 2: The machine learning task accelerator of Clause 1, further comprising one or more digital signal processing units (DSPUs), each respective DSPU of the one or more DSPUs comprising: a DSPU DMAC circuit configured to perform digital multiplication and accumulation operations; a local activation buffer connected to the DMAC circuit and configured to store activation data for processing by the DMAC circuit; a DSPU nonlinear operation circuit connected to the DMAC circuit and configured to perform nonlinear processing on the data output from the DMAC circuit; a DSPU hardware sequencer circuit connected to configured to execute instructions received from the host system and control operation of the respective DSPU; and a DSPU local direct memory access (DMA) controller configured to control access to a shared activation buffer.

Clause 3: The machine learning task accelerator of any one of Clauses 1-2, further comprising a shared activation buffer connected to the one or more MSPUs and configured to store output activation data generated by the one or more MSPUs.

Clause 4: The machine learning task accelerator of any one of Clauses 1-3, wherein the first nonlinear operation circuit comprises a cubic approximator and a gain block.

Clause 5: The machine learning task accelerator of any one of Clauses 1-4, wherein at least one respective MSPU of the one or more MSPUs further comprises a CIM finite state machine (FSM) configured to control writing of weight data and activation data to the respective MSPU's CIM circuit.

Clause 6: The machine learning task accelerator of any one of Clause 1-5, further comprising a plurality of registers connected to the one or more MSPUs and configured to enable data communication directly between the MSPUs.

Clause 7: The machine learning task accelerator of any one of Clauses 1-6, wherein at least one respective MSPU of the one or more MSPUs further comprises a digital post processing circuit configured to apply one of a gain, a bias, a shift or a pooling operation.

Clause 8: The machine learning task accelerator of claim 7, wherein the digital post processing circuit comprises at least one ADC of the one or more ADCs of the respective MSPU.

Clause 9: The machine learning task accelerator of any one of Clauses 1-8, further comprising a tiling control circuit configured to: cause weight data for a single layer of a neural network model to be loaded into at least two separate CIM circuits of two separate MSPUs of the one or more MSPUs; receive partial output from the two separate MSPUs; and generate final output based on the partial outputs.

Clause 10: The machine learning task accelerator of Clause 9, wherein the tiling control circuit is further configured to control an interconnection of rows between the at least two separate CIM circuits.

Clause 11: The machine learning task accelerator of any one of Clauses 1-10, wherein the one or more MSPUs are configured to perform processing of a convolutional neural network layer of a convolutional neural network model.

Clause 12: The machine learning task accelerator of Clause 11, wherein the one or more MSPUs are configured to perform processing of a fully connected layer of the convolutional neural network model.

Clause 13: The machine learning task accelerator of Clause 11, further comprising: a shared nonlinear operation circuit configured to perform processing of a pointwise convolution of the convolutional neural network layer, wherein: the convolutional neural network layer comprises a depthwise separable convolutional neural network layer, and at least one of the one or more MSPUs is configured to perform processing of a depthwise convolution of the convolutional neural network layer.

Clause 14: The machine learning task accelerator of any one of Clauses 1-13, wherein the one or more MSPUs are configured to perform processing of a recurrent layer of a neural network model.

Clause 15: The machine learning task accelerator of any one of Clauses 1-14, wherein the one or more MSPUs are configured to perform processing of a long short-term memory (LSTM) layer of a neural network model.

Clause 16: The machine learning task accelerator of any one of Clauses 1-15, wherein the one or more MSPUs are configured to perform processing of a gated recurrent unit (GRU) layer of a neural network model.

Clause 17: The machine learning task accelerator of any one of Clauses 1-16, wherein the one or more MSPUs are configured to perform processing of a transformer layer of a neural network model.

Clause 18: The machine learning task accelerator of Clause 17, wherein the transformer layer comprises an attention component and a feed forward component.

Clause 19: The machine learning task accelerator of any one of Clauses 1-18, further comprising a hardware sequencer memory connected to the hardware sequencer circuit and configured store the instructions received from the host system.

Clause 20: The machine learning task accelerator of any one of Clauses 1-19, wherein the CIM circuit of each of the one or more MSPUs comprising a CIM circuit comprises a plurality of static random-access memory (SRAM) bit cells.

Clause 21: A method of processing machine learning model data with a machine learning task accelerator, comprising: configuring one or more mixed signal processing units (MSPUs) of the machine learning task accelerator to process a machine learning model; providing model input data to the one or more configured MSPUs; processing the model input data with the machine learning model using the one or more configured MSPUs; and receiving output data from the one or more configured MSPUs.

Clause 22: The method of Clause 21, wherein: each of the one or more MSPUs comprises: a compute-in-memory (CIM) circuit; a local activation buffer connected to the CIM circuit and configured to store activation data for processing by the CIM circuit; one or more analog to digital converters (ADCs) connected to the CIM circuit and configured to convert analog computation result signals from the CIM circuit to digital computation result data; a first nonlinear operation circuit connected to one or more outputs of the one or more ADCs and configured to perform nonlinear processing on the digital computation result data; a hardware sequencer circuit connected to configured to execute instructions received from a host system and control operation of the MSPU; and a local direct memory access (DMA) controller configured to control access to a shared activation buffer, and the machine learning task accelerator comprises: a digital multiplication and accumulation (DMAC) circuit connected to the one or more MSPUs and configured to perform multiplication and accumulation operations on activation data output from one or more of the one or more MSPUs; a digital element-wise multiplication and accumulation circuit connected to the one or more MSPUs and configured to perform element-wise multiplication and element-wise accumulation operations on activation data output from one or more of the one or more MSPUs; and a second nonlinear operation circuit connected to the one or more MSPUs.

Clause 23: The method of Clause 22, wherein the machine learning task accelerator further comprises a shared activation buffer connected to the one or more MSPUs and configured to store output activation data generated by the one or more MSPUs.

Clause 24: The method of any one of Clauses 22-23, wherein the machine learning model comprises a convolutional neural network model.

Clause 25: The method of any one of Clauses 22-24, wherein processing the model input data with the machine learning model comprises: performing a depthwise convolution operation of a depthwise separable convolution operation with a CIM circuit of the one or more MSPUs; and performing a pointwise convolution operation of the depthwise separable convolution operation with the DMAC circuit.

Clause 26: The method of any one of Clauses 22-25, wherein the machine learning model comprises a recurrent neural network model.

Clause 27: The method of Clause 26, wherein the machine learning model comprises at least one long short-term memory (LSTM) layer.

Clause 28: The method of Clause 26, wherein the machine learning model comprises at least one gated recurrent unit (GRU) layer.

Clause 29: The method of any one of Clauses 22-28, wherein the machine learning model comprises a transformer neural network model comprising an attention component and a feed forward component.

Clause 30: The method of any one of Clauses 22-29, further comprising: loading weight data for a single layer of the machine learning model in at least two separate CIM circuits of two separate MSPUs of the one or more MSPUs; receiving partial output from the two separate MSPUs; and generating final output based on the received partial outputs.

Clause 31: A processing system, comprising: a memory comprising computer-executable instructions; one or more processors configured to execute the computer-executable instructions and cause the processing system to perform a method in accordance with any one of Clauses 21-30.

Clause 32: A processing system, comprising means for performing a method in accordance with any one of Clauses 21-30.

Clause 33: A non-transitory computer-readable medium comprising computer-executable instructions that, when executed by one or more processors of a processing system, cause the processing system to perform a method in accordance with any one of Clauses 21-30.

Clause 34: A computer program product embodied on a computer-readable storage medium comprising code for performing a method in accordance with any one of Clauses 21-30.

ADDITIONAL CONSIDERATIONS

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, the term "connected to", in the context of sharing electronic signals and data between the elements described herein, may generally mean in data communication between the respective elements that are connected to each other. In some cases, elements may be directly connected to each other, such as via one or more conductive traces, lines, or other conductive carriers capable of carrying signals and/or data between the respective elements that are directly connected to each other. In other cases, elements may be indirectly connected to each other, such as via one or more data busses or similar shared circuitry and/or integrated circuit elements for communicating signals and data between the respective elements that are indirectly connected to each other.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A machine learning task accelerator, comprising:
one or more mixed signal processing units (MSPUs), each respective MSPU of the one or more MSPUs comprising:
a compute-in-memory (CIM) circuit;
a local activation buffer connected to the CIM circuit and configured to store activation data for processing by the CIM circuit;
one or more analog to digital converters (ADCs) connected to the CIM circuit and configured to convert analog computation result signals from the CIM circuit to digital computation result data;
a first nonlinear operation circuit connected to one or more outputs of the one or more ADCs and configured to perform nonlinear processing on the digital computation result data;
a hardware sequencer circuit configured to execute instructions received from a host system and control operation of the MSPU; and
a local direct memory access (DMA) controller configured to control access to a shared activation buffer;
a digital multiplication and accumulation (DMAC) circuit connected to the one or more MSPUs and configured to perform multiplication and accumulation operations on activation data output from one or more of the one or more MSPUs;
a digital element-wise multiplication and accumulation circuit connected to the one or more MSPUs and configured to:
perform element-wise multiplication and element-wise accumulation operations on activation data output from one or more of the one or more MSPUs; and
generate an output signal based on the element-wise multiplication and element-wise accumulation operations, wherein the output signal is provided back as input to the digital element-wise multiplication and accumulation circuit via a delay loop; and
a second nonlinear operation circuit connected to the one or more MSPUs, wherein the second nonlinear operation circuit is configured to receive the output signal.

2. The machine learning task accelerator of claim 1, further comprising one or more digital signal processing units (DSPUs), each respective DSPU of the one or more DSPUs comprising:
a DSPU DMAC circuit configured to perform digital multiplication and accumulation operations;
a DSPU local activation buffer connected to the DMAC circuit and configured to store activation data for processing by the DMAC circuit;

a DSPU nonlinear operation circuit connected to the DMAC circuit and configured to perform nonlinear processing on the data output from the DMAC circuit;
a DSPU hardware sequencer circuit connected to configured to execute instructions received from the host system and control operation of the respective DSPU; and
a DSPU local direct memory access (DMA) controller configured to control access to a shared activation buffer.

3. The machine learning task accelerator of claim 1, further comprising a shared activation buffer connected to the one or more MSPUs and configured to store output activation data generated by the one or more MSPUs.

4. The machine learning task accelerator of claim 1, wherein the first nonlinear operation circuit comprises a cubic approximator and a gain block.

5. The machine learning task accelerator of claim 1, wherein at least one respective MSPU of the one or more MSPUs further comprises a CIM finite state machine (FSM) configured to control writing of weight data and activation data to the respective MSPU's CIM circuit.

6. The machine learning task accelerator of claim 1, further comprising a plurality of registers connected to the one or more MSPUs and configured to enable data communication directly between the MSPUs.

7. The machine learning task accelerator of claim 1, wherein at least one respective MSPU of the one or more MSPUs further comprises a digital post processing circuit configured to apply one of a gain, a bias, a shift or a pooling operation.

8. The machine learning task accelerator of claim 7, wherein the digital post processing circuit comprises at least one ADC of the one or more ADCs of the respective MSPU.

9. The machine learning task accelerator of claim 1, further comprising a tiling control circuit configured to:
cause weight data for a single layer of a neural network model to be loaded into at least two separate CIM circuits of two separate MSPUs of the one or more MSPUs;
receive partial output from the two separate MSPUs; and
generate final output based on the partial outputs.

10. The machine learning task accelerator of claim 9, wherein the tiling control circuit is further configured to control an interconnection of rows between the at least two separate CIM circuits.

11. The machine learning task accelerator of claim 1, wherein the one or more MSPUs are configured to perform processing of a convolutional neural network layer of a convolutional neural network model.

12. The machine learning task accelerator of claim 11, wherein the one or more MSPUs are configured to perform processing of a fully connected layer of the convolutional neural network model.

13. The machine learning task accelerator of claim 11, further comprising:
a shared nonlinear operation circuit configured to perform processing of a pointwise convolution of the convolutional neural network layer, wherein:
the convolutional neural network layer comprises a depthwise separable convolutional neural network layer, and
at least one of the one or more MSPUs is configured to perform processing of a depthwise convolution of the convolutional neural network layer.

14. The machine learning task accelerator of claim 1, wherein the one or more MSPUs are configured to perform processing of a recurrent layer of a neural network model.

15. The machine learning task accelerator of claim 1, wherein the one or more MSPUs are configured to perform processing of a long short-term memory (LSTM) layer of a neural network model.

16. The machine learning task accelerator of claim 1, wherein the one or more MSPUs are configured to perform processing of a gated recurrent unit (GRU) layer of a neural network model.

17. The machine learning task accelerator of claim 1, wherein the one or more MSPUs are configured to perform processing of a transformer layer of a neural network model.

18. The machine learning task accelerator of claim 17, wherein the transformer layer comprises an attention component and a feed forward component.

19. The machine learning task accelerator of claim 1, further comprising a hardware sequencer memory connected to the hardware sequencer circuit and configured to store the instructions received from the host system.

20. The machine learning task accelerator of claim 1, wherein the CIM circuit of each of the one or more MSPUs comprising a CIM circuit comprises a plurality of static random-access memory (SRAM) bit cells.

21. A method of processing machine learning model data with a machine learning task accelerator, comprising:

configuring one or more mixed signal processing units (MSPUs) of the machine learning task accelerator to process a machine learning model;

providing model input data to the one or more configured MSPUs;

processing the model input data with the machine learning model using the one or more configured MSPUs; and receiving output data from the one or more configured MSPUs, wherein the machine learning task accelerator comprises:

a digital multiplication and accumulation (DMAC) circuit connected to the one or more MSPUs and configured to perform multiplication and accumulation operations on activation data output from one or more of the one or more MSPUs;

a digital element-wise multiplication and accumulation circuit connected to the one or more MSPUs and configured to:

perform element-wise multiplication and element-wise accumulation operations on activation data output from one or more of the one or more MSPUs; and generate an output signal based on the element-wise multiplication and element-wise accumulation operations, wherein the output signal is provided back as input to the digital element-wise multiplication and accumulation circuit via a delay loop; and a second nonlinear operation circuit connected to the one or more MSPUs, wherein the second nonlinear operation circuit is configured to receive the output signal.

22. The method of claim 21, wherein:

each of the one or more MSPUs comprises:

a compute-in-memory (CIM) circuit;

a local activation buffer connected to the CIM circuit and configured to store activation data for processing by the CIM circuit;

one or more analog to digital converters (ADCs) connected to the CIM circuit and configured to convert analog computation result signals from the CIM circuit to digital computation result data;

a first nonlinear operation circuit connected to one or more outputs of the one or more ADCs and configured to perform nonlinear processing on the digital computation result data;

a hardware sequencer circuit connected to configured to execute instructions received from a host system and control operation of the MSPU; and a local direct memory access (DMA) controller configured to control access to a shared activation buffer.

23. The method of claim 22, wherein the machine learning task accelerator further comprises a shared activation buffer connected to the one or more MSPUs and configured to store output activation data generated by the one or more MSPUs.

24. The method of claim 22, wherein the machine learning model comprises a convolutional neural network model.

25. The method of claim 22, wherein processing the model input data with the machine learning model comprises:

performing a depthwise convolution operation of a depthwise separable convolution operation with a CIM circuit of the one or more MSPUs; and performing a pointwise convolution operation of the depthwise separable convolution operation with the DMAC circuit.

26. The method of claim 22, wherein the machine learning model comprises a recurrent neural network model.

27. The method of claim 26, wherein the machine learning model comprises at least one long short-term memory (LSTM) layer.

28. The method of claim 26, wherein the machine learning model comprises at least one gated recurrent unit (GRU) layer.

29. The method of claim 22, wherein the machine learning model comprises a transformer neural network model comprising an attention component and a feed forward component.

30. The method of claim 22, further comprising:

loading weight data for a single layer of the machine learning model in at least two separate CIM circuits of two separate MSPUs of the one or more MSPUs;

receiving partial output from the two separate MSPUs; and generating final output based on the received partial outputs.

* * * * *